United States Patent
Yoon et al.

(10) Patent No.: US 6,479,887 B1
(45) Date of Patent: Nov. 12, 2002

(54) CIRCUIT PATTERN TAPE FOR WAFER-SCALE PRODUCTION OF CHIP SIZE SEMICONDUCTOR PACKAGES

(75) Inventors: Ju-Hoon Yoon, Seoul (KR); Dae-Byung Kang, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/387,377

(22) Filed: Aug. 30, 1999

(30) Foreign Application Priority Data

| Aug. 31, 1998 | (KR) | 98-35605 |
| Aug. 31, 1998 | (KR) | 98-35606 |
| Aug. 31, 1998 | (KR) | 98-35607 |
| Aug. 31, 1998 | (KR) | 98-35613 |
| Aug. 31, 1998 | (KR) | 98-35615 |
| Aug. 31, 1998 | (KR) | 98-35616 |

(51) Int. Cl.$^7$ .................... H01L 23/495; H01L 23/48; H01L 23/52; H01L 29/40
(52) U.S. Cl. .................. 257/666; 257/667; 257/786
(58) Field of Search .................. 257/713, 909, 257/666, 786, 667; 438/113, 114, 435

(56) References Cited

U.S. PATENT DOCUMENTS

| 3,810,301 A | 5/1974 | Cook | 29/593 |
| 4,985,988 A | 1/1991 | Littlebury | 29/827 |
| 5,049,434 A | 9/1991 | Wasulko | 428/202 |
| 5,092,954 A | 3/1992 | Braun et al. | 156/540 |

(List continued on next page.)

OTHER PUBLICATIONS

Yoon et al., U.S. Patent Application Ser. No. 09/385,694 filed Aug. 30, 1999 entitled "Wafer–Scale Production of Chip–Scale Semiconductor Packages Using Wafer Mapping Techniques".

Yoon et al., U.S. Patent Application Ser. No. 09/385,695 filed Aug. 30, 1999 entitled "Method for Laminating Circuit Pattern Tape Over Wafer".

Ohzone, et al., "A Study on Hot–Carrier–Induced Photoemission in n–MOSFET's Under Dynamic Operation", Toyama National College of Technology, pp. 75–80.

Braun, Alexander E., "Defect Detection Overcomes Limitations," Semiconductor International; ; Newtown; Feb. 1999, pp. 1–9.

*Primary Examiner*—Carl Whitehead, Jr.
*Assistant Examiner*—Kiesha Rose

(57) ABSTRACT

A circuit pattern tape for the wafer-scale production of chip size semiconductor packages is adapted to be laminated onto a semiconductor wafer and includes a flexible insulating layer, a plurality of identical circuit pattern units arrayed thereon, and a solder mask covering the circuit patterns. Each circuit pattern unit includes a central opening, a plurality of bond fingers arranged on opposite sides of the opening and electrically connected through the opening to associated die pads on an underlying semiconductor chip in the wafer, a plurality of solder ball lands, each having a solder ball attached thereto, and a plurality of conductive traces electrically connecting respective ones of the bond fingers and the solder ball lands to each other. The bond fingers and central opening are arranged so that they do not intersect singulation lines defining the coincident edges of the corresponding individual circuit pattern units and chips after they are cut from the wafer-tape assembly, thereby eliminating chipping of the wafer. The circuit pattern units may include a dummy pattern that is made of the same conductive metal as the solder ball lands, the conductive traces, and the bond fingers, and which is arranged on the circuit pattern to achieve a uniform distribution of the conductive metal thereon and thereby minimize voids between the tape and the wafer and bowing in the dissimilar materials of the tape due to a change in its temperature.

28 Claims, 37 Drawing Sheets

U.S. PATENT DOCUMENTS

| | | | |
|---|---|---|---|
| 5,148,265 A | 9/1992 | Khandros et al. | 357/80 |
| 5,151,388 A | 9/1992 | Bakhit et al. | 437/209 |
| 5,258,330 A | 11/1993 | Khandros et al. | 437/209 |
| 5,384,689 A | 1/1995 | Shen | 361/761 |
| 5,470,411 A | 11/1995 | Gloton et al. | 156/64 |
| 5,477,611 A | 12/1995 | Sweis et al. | 29/840 |
| 5,519,936 A | 5/1996 | Andros et al. | 29/840 |
| 5,536,909 A | 7/1996 | DiStefano et al. | 174/261 |
| 5,625,232 A | 4/1997 | Numata et al. | 257/758 |
| 5,633,785 A | 5/1997 | Parker et al. | 361/766 |
| 5,684,330 A | 11/1997 | Lee | 257/692 |
| 5,753,974 A | 5/1998 | Masukawa | 257/737 |
| 5,759,873 A | 6/1998 | Kata et al. | 438/118 |
| 5,838,951 A | 11/1998 | Song | 395/500 |
| 5,858,815 A | 1/1999 | Heo et al. | 438/112 |
| 5,864,470 A * | 1/1999 | Shim et al. | 361/777 |
| 5,866,949 A | 2/1999 | Schueller | 257/778 |
| 5,897,334 A | 4/1999 | Ha et al. | 438/107 |
| 5,929,528 A * | 7/1999 | Kinugawa | 257/750 |
| 5,950,070 A | 9/1999 | Razon et al. | 438/113 |
| 5,989,982 A | 11/1999 | Yoshikazu | 438/462 |
| 5,990,545 A | 11/1999 | Schueller et al. | 257/697 |
| 6,000,124 A | 12/1999 | Saito et al. | 29/830 |
| 6,028,354 A | 2/2000 | Hoffman | 257/706 |
| 6,043,109 A | 3/2000 | Yang et al. | 438/113 |
| 6,118,665 A | 9/2000 | Kishida et al. | 361/749 |
| 6,132,588 A * | 10/2000 | Yoshizawa et al. | 205/125 |
| 6,132,910 A * | 10/2000 | Kojima | 430/22 |
| 6,144,102 A | 11/2000 | Amagai | 257/781 |
| 6,207,477 B1 | 3/2001 | Motooka et al. | 438/113 |
| 6,248,612 B1 * | 6/2001 | Castro et al. | 438/106 |
| 6,252,298 B1 | 6/2001 | Lee et al. | 257/668 |

* cited by examiner

US 6,479,887 B1

CIRCUIT PATTERN TAPE FOR WAFER-SCALE PRODUCTION OF CHIP SIZE SEMICONDUCTOR PACKAGES

RELATED APPLICATIONS

This Application is related to U.S. patent application Ser. No. 09/385,694, which was filed on Aug. 30, 1999, and U.S. Pat. application Ser. No. 09/385,695, which is now U.S. Pat. No. 6,428,641, and which issued on Aug. 6, 2000.

BACKGROUND OF THE INVENTION

1. Field of the Invention

The present invention relates to a circuit pattern tape for semiconductor packages, and a semiconductor package produced using the novel circuit pattern tape. More particularly, the present invention relates to a circuit pattern tape that is particularly adapted for use in the wafer-scale production of chip size semiconductor packages.

2. Description of the Related Art

As a result of the recent trend in the consumer and industrial electronics markets toward designs that are higher in performance, yet more compact in size, such as communication devices and computers, a demand has arisen for semiconductor packages that have substantially higher input/output pin densities, yet which are simpler and more compact, for use in such devices.

This demand has resulted in the development of a semiconductor package having a size that is nearly the same as that of the semiconductor chip packaged therein. This style of package is referred to in the industry as a "chip size," or a "chip scale," or a "chip-on-board" semiconductor package. Currently, the demand for such semiconductor packages is increasing.

Chip size semiconductor packages are fabricated at a wafer scale level by laminating a circuit pattern tape having a plurality of individual circuit pattern units in it onto the surface of a semiconductor wafer having a plurality of corresponding individual semiconductor dies, or "chip" units, in it, to form an assembly, followed by the application to the laminated assembly of a well-known packaging process involving, typically, a wire bonding process for electrically connecting the circuit patterns of the circuit pattern tape to die pads on the semiconductor chips in the wafer, a resin molding process for encapsulating the wire bonding areas of the wafer within a protective resin envelope, a solder ball attachment process for attaching solder balls that are used as external input/output terminals of the package to the wafer, and lastly, a "singulation" process, wherein the processed wafer assembly is cut apart to divide the assembly into a plurality of finished, individual semiconductor packages.

FIG. 16A is a plan view of a conventional circuit pattern tape 10' for semiconductor packages. A plurality of individual circuit pattern units 11 are formed in the circuit pattern tape, the units corresponding on a one-to-one basis to a plurality of individual chip units 3 formed in a semiconductor wafer 2 (see FIG. 17A). Each circuit pattern unit 11 has its own independent, conductive circuit pattern. An insulative solder mask 19 is formed over selected portions of the conductive circuit patterns on the tape, as described below.

FIG. 16B is a magnified view of the circled portion F of the tape shown in FIG. 16A. In the illustrated portion, four identical circuit pattern units 11 are shown joined together at their edges. In FIG. 16B, the reference numeral 12 denotes conductive traces. The solder mask 19 includes openings in it through which one end of each of the conductive traces 12 is exposed. The exposed end of each conductive trace 12 is connected to a solder ball land 13 to which a solder ball (not shown) is attached. Each conductive trace 12 is connected at its other end to an associated one of a plurality of bond fingers formed within a bond finger region 15. A plurality of such conductive traces 12 form the circuit pattern of each circuit pattern unit 11.

The bond finger regions 15, like the solder ball lands 13, are not covered by the solder mask 19, so that the bond fingers 14 are left exposed. An opening region 16' is defined within each bond finger formation region 15. The opening regions 16' are punched to form openings 16 prior to laminating the circuit pattern tape 10' onto the wafer 2. Die bonding pads 4 (see FIG. 17B) on each semiconductor chip unit 3 are upwardly exposed through an associated one of openings. The exposed die pads are connected to respective bond fingers 14 by means of fine, conductive bonding wires 40 (see FIG. 19).

In FIG. 16B, reference numeral 17 denotes high-current-density "bus" lines. The bus lines 17 are used in an electrolytic or electroless plating process to form a nickel (Ni)/gold (Au) plating on the solder ball lands 13 and/or on the bond fingers 14. The Ni/Au plating makes it easy to attach the solder balls (not shown) to the lands 13, and/or to bond the bonding wires (see FIG. 19) to the bond fingers 14, respectively. The bus lines 17 are later removed when the wafer is singulated, or cut, along the singulation lines 21, which disconnects the conductive traces 12 from each other electrically.

When chip size semiconductor packages are fabricated using the conventional circuit pattern tape 10' described above, it is difficult to accurately determine the cutting line for singulation of the circuit pattern units 11 because the space between adjacent circuit pattern units 11 is extremely narrow. As a result, even when there is only a microscopic error in the determination of the cutting line, the bus lines 17 may be only partially removed. This can result in a problem, in that a number of defective semiconductor packages may be produced as a result.

FIG. 16C is a cross-sectional view taken along the line VII—VII in FIG. 16A. FIG. 16D is a cross-sectional view taken along the line VIII—VIII in FIG. 16B. FIGS. 16C and 16D respectively illustrate the cross-sectional structure of the conventional circuit pattern tape 10'. The lowermost layer of the tape structure is an insulating polyimide layer 18. Conductive traces 12 and solder ball lands 13 are formed on the surface of the polyimide layer 18. Bond fingers 14 are also formed on the polyimide layer 18 around the respective openings 16. The solder mask 19 is formed over the conductive traces 12. The solder ball lands 13 and bond fingers 14 are upwardly exposed through openings in the solder mask 19. At the peripheral region of each circuit pattern unit 11, a thin, conductive metal film 12' is laminated over the polyimide layer 18. The solder mask 19 also covers the thin, conductive metal film 12'.

In the conventional circuit pattern tape 10' described above, only the bond fingers 14, which receive output signals from an associated semiconductor chip 3 (see FIG. 19), are formed in the bond finger regions 15 of each circuit pattern unit 11, as shown in FIGS. 16B and 16D. For this reason, in order to provide ground bonding of ground signals from respective semiconductor chips, it is necessary to connect together a number of the conductive traces 12 connected to the bond fingers 14, for example, by electrically connecting together a number of the solder ball lands 13. As a result of this, the circuit pattern has a reduced spatial redundancy for the formation of the circuit pattern, i.e., the conductive traces 12, at each of the regions where such a grounding connection is made. Furthermore, the bond fingers that are to be ground-bonded must be disposed at locations that correspond to the ground signal locations. This can severely limit the freedom of design of the circuit tape pattern, and results in a limitation on the number of die bonding pads on the associated semiconductor chips that can be effectively accommodated.

FIG. 17A is a plan view of a typical wafer 2 partitioned into a plurality of semiconductor chip units 3 by singulation lines 21. The singulation lines 21 may be real or imaginary, and typically consist of lines, or "streets," scribed in the surface of the wafer 2. FIG. 17B is a magnified view of the circled portion G in FIG. 17A. FIGS. 17A and 17B illustrate wire bonding die pads 4 formed on the active surface of each semiconductor chip unit 3. It should be understood that the arrangement of the die pads 4 shown is intended for illustrative purposes only, as the die pads 4 may be arranged in one or more columns.

FIG. 18A is a plan view of the laminated wafer assembly that is obtained prior to the singulation process by laminating the conventional circuit pattern tape 10' shown in FIG. 16A onto the wafer 2 shown in FIG. 17A, and then applying the above-described packaging processes to it, thereby forming a plurality of connected semiconductor packages 1,' each having a conventional package structure. FIG. 18B is a magnified view of the circled portion H in FIG. 18A. In FIG. 18B, the openings 16 shown are formed by punching holes in the circuit pattern tape 10' at its opening regions 16'. After punching, the resultant circuit pattern tape 10' is laminated onto the wafer 2. After a wire bonding process, a liquid epoxy resin is dispensed into the openings 16 and the bond finger regions 15 of the resultant wafer assembly and then cured, thereby forming protective resin envelopes 50 around the protected elements. Two resin envelopes 50 are formed on each semiconductor package 1'. Each semiconductor package 1' thus shares a portion of each resin envelope 50 with an adjacent semiconductor package 1'. One singulation line 21 extends centrally across each resin envelope 50. The resin envelopes 50 are adapted to protect the delicate bonding wires 40, the bond fingers 14, the die bonding pads 4, and their adjacent surfaces from harmful environmental elements, for example, moisture. After the formation of the resin envelopes 50, solder balls 60 (see FIG. 19), which serve as external input/output terminals of the packages, are attached to associated solder ball lands 13, respectively.

Semiconductor packages fabricated with the conventional circuit pattern tape 10' described above frequently experience a problem during the singulation process. This problem relates to the fact that the singulation lines 21 on the wafer 2 are not visible because, even though the polyimide layer 18 and the adhesive layer 30 are semitransparent, the solder mask 19 and circuit patterns of the circuit pattern tape 10' are opaque. To overcome this obstacle, the circuit pattern tape 10' is also provided with singulation lines 21. However, where the circuit pattern tape 10', which is laminated on the wafer 2, exhibits a relatively high amount of stretching before or during the lamination process, it is very difficult to determine the singulation position of each circuit pattern unit 11 accurately relative to its associated semiconductor chip unit 3 without some positional error arising. For this reason, it is difficult to achieve consistent, accurate singulation of semiconductor packages 1' that have a consistently accurate and standard size. This results in a reduced yield of semiconductor packages from the wafer.

The process for laminating the conventional circuit pattern tape 10' to the wafer 2 is carried out at a high temperature. This creates another problem, in the case of a conventional circuit pattern tape 10' having a non-uniform distribution of the conductive metal forming the circuit pattern, in that voids are easily formed in the circuit pattern tape 10' due to the relatively high difference between the respective thermal coefficients of expansion of the conductive metal and the resin material of the polyimide layer 18 and/or the solder mask 19.

Moreover, a "bowing" phenomenon can occur in the wafer assembly when the wafer 2 is laminated with the conventional circuit pattern tape 10' at a high temperature, and the assembly then returned to room temperature. This problem also results from the relatively large differences between the respective thermal coefficients of expansion of the conductive metal and the resin material of the polyimide layer 18 and/or the solder mask 19. This bowing phenomenon may become quite severe when the conventional circuit pattern tape 10' described above is used. This is because the conventional circuit pattern tape 10' has the thin, planar, conductive metal film 12' described above, which has a relatively large area, interposed between the polyimide layer 18 and the solder mask 19. The bowing phenomenon makes it difficult to attach the circuit pattern tape 10' to the wafer in an accurate, "flat" state. Furthermore, the bowing makes the smooth implementation of sequent processes difficult. As a result, an unacceptably high number of defective semiconductor packages may be produced from the wafer.

Yet another problem is involved in the manufacture of semiconductor packages using the conventional circuit pattern tape 10' described above. This problem relates to the fact that, when a liquid encapsulation material exhibiting a relatively high degree of "flowability," such as a liquid epoxy resin, is dispensed into the openings 16, it can easily overflow the openings and spill out onto the laminated assembly. If the overflowing liquid epoxy material reaches the exposed solder ball lands 13, it renders it practically impossible to attach solder balls 60 to them. Alternately, a short circuit can easily occur between adjacent solder balls 60 and solder ball lands 13. This results in defective semiconductor packages.

In an effort to prevent the overflow of liquid encapsulation material, it has been proposed to increase the thickness of the solder mask 19. However, this is not an effective solution to the problem because it is very difficult to control the diameter of each solder ball land 13, as defined by an opening in the thicker solder mask 19. Furthermore, it is difficult to control the height of each solder ball 60 uniformly because of the greater depth of the solder ball lands 13. This can result in either a short circuit or an open circuit between the solder balls 60 and the electrodes of a mother board (not shown) to which the associated semiconductor package is mounted. Therefore, to prevent an overflow of the liquid encapsulation material, it is more preferable to dispense a very accurately metered amount of liquid encapsulation material into the openings 16 of the circuit pattern tape 10'. However, as a practical matter, this is difficult, particularly where the encapsulation material has a relatively high viscosity.

FIG. 18C is a cross-sectional view through the wafer assembly taken along the line IX—IX in FIG. 18B. As shown in FIG. 18C, a plurality of semiconductor packages 1' having a conventional structure is formed in the wafer assembly. As described above, adjacent semiconductor packages share one resin envelope 50 with each other. A singulation line 21 extends centrally across each resin envelope 50. The semiconductor packages 1' are cut, or singulated, into individual packages along the singulation lines 21. In a typical singulation process, the semiconductor wafer 2, the circuit pattern tape 10' and the resin envelopes 50 are cut through simultaneously, usually by sawing.

During the singulation process, the rotational speed and feed rate of the saw blade necessary to cut through the resin envelopes 50 must be greater than that used to cut through the wafer 2 alone because the resin envelopes 50 have different physical characteristics and a higher rupture strength than that of the wafer, which is typically made of silicon. For this reason, when both the resin envelopes 50 and the wafer 2 are sawn simultaneously, an excessive sawing force is applied to the wafer 2 by the saw blade, thereby causing a chipping phenomenon in the wafer in which the sawn halves of the wafer 2 are chipped along the kerf of the saw. This chipping results in problems, in that cracks can be formed at the singulation surfaces of the semiconductor packages 1' that provide paths for penetration of harmful moisture or other foreign contaminants into the semiconductor packages 1'. As a result, the life span of the packages 1' may be substantially reduced. Where the cracks caused by chipping are relatively wide, defective semiconductor packages 1' result. For example, the semiconductor packages 1' may function unreliably, or they may be rendered totally inoperable.

FIG. 19 is a cross-sectional view illustrating a conventional semiconductor package 1' fabricated using the conventional circuit pattern tape 10' shown in FIG. 16A. Referring to FIG. 19, the circuit pattern tape 10' is laminated on a semiconductor chip 3 in such a fashion that the adhesive layer 30 is interposed between the semiconductor chip 3 and the circuit pattern tape 10'. An opening 16 is centrally formed at the semiconductor package 1'. Die pads 4 on the chip 3 are arranged in the opening 16. The circuit pattern tape 10' consists of a polyimide layer 18, a circuit pattern, and a solder mask layer 19 arranged in ascending order. The circuit pattern consists of a plurality of conductive traces, each formed with one solder ball land 13 and a bond finger 14. The die pads 4 are electrically coupled to associated bond fingers 14 by means of fine, conductive bonding wires 40. A resin envelope 50 is formed in the region that includes the opening 16, the bond fingers, and the bonding wires 40. Solder balls 60 are shown attached to each solder ball land 13 as external input/output terminals of the package 1'.

BRIEF SUMMARY OF THE INVENTION

The present invention provides a circuit pattern tape that effectively eliminates wafer chipping during package singulation by the provision of a resin envelope formation region on the tape that does not intersect the singulation lines of the circuit pattern tape and the wafer.

The circuit pattern tape of this invention also effectively prevents or substantially inhibits the formation of voids during lamination of the tape to a wafer by the provision of a first dummy pattern on the tape adapted to provide a uniform distribution of the conductive metal on the tape from which the circuit patterns are formed.

The present invention also provides a circuit pattern tape capable of precisely locating singulation lines on the laminated wafer-tape assembly by the provision of singulation line locating grooves in the tape, each of which is located in a region where four adjacent circuit pattern units join together.

The circuit pattern tape of the invention also effectively prevents or substantially reduces the bowing phenomenon occurring during a high temperature lamination process, or during subsequent fabrication processes, caused by the use of materials having dissimilar thermal coefficients of expansion, by the provision of a second dummy pattern disposed between a central circuit pattern unit portion of the tape and a peripheral portion arranged around the central portion, and/or a bowing-prevention element that is not coated with a solder mask, and/or by the provision of a second dummy pattern arranged at the peripheral portion of the tape.

The present invention also provides a circuit pattern tape that avoids a reduced spatial redundancy in the pattern units, caused by the need to interconnect a large number of conductive traces for grounding purposes, by the provision of ground fingers formed at bond finger formation regions located on opposite sides of an opening formation region.

The present invention also provides a circuit pattern tape that permits the easy and complete removal of plating bus lines, even when there is a slight error involved in the singulation process, by the provision of bus lines that are located in the opening formation region inside the bond finger formation regions.

The circuit pattern tape of the present invention also prevents the overflow of liquid encapsulating material during the formation of protective resin envelopes by the provision of one or more liquid encapsulant retaining dams located adjacent to the resin envelope formation regions.

The invention also provides a chip size semiconductor package in which any one or more of the above-described advances over the prior art are readily achieved.

BRIEF DESCRIPTION OF THE SEVERAL VIEWS OF THE DRAWINGS

The above and other advantages and aspects of the invention will become apparent from a consideration of the following detailed description of its preferred embodiments, particularly if considered with reference to the accompanying drawings, in which.

DETAILED DESCRIPTION OF THE INVENTION

This invention corresponds substantially to those disclosed in Korean Patent Application Nos. 98-35605, 98-35606, 98-35607, 98-35613, 98-35615, and 98-35616, all of which were filed on Aug. 31, 1998, and the disclosures of which, by this reference, are incorporated herein in their entireties.

Figure 1A:
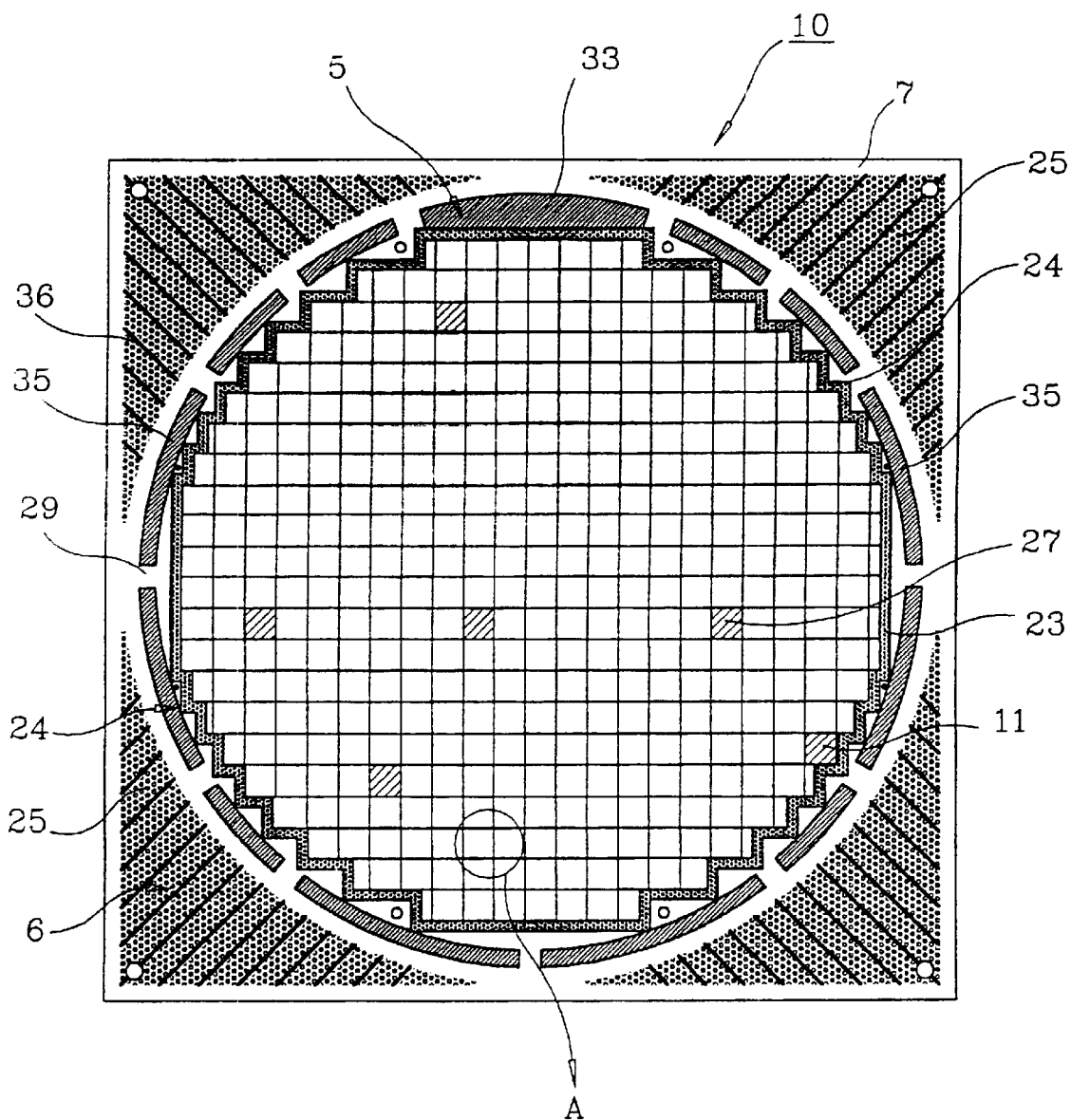
FIG. 1A is a plan view of a circuit pattern tape for semiconductor packages according to a first embodiment of the present invention.
Figure 1B:
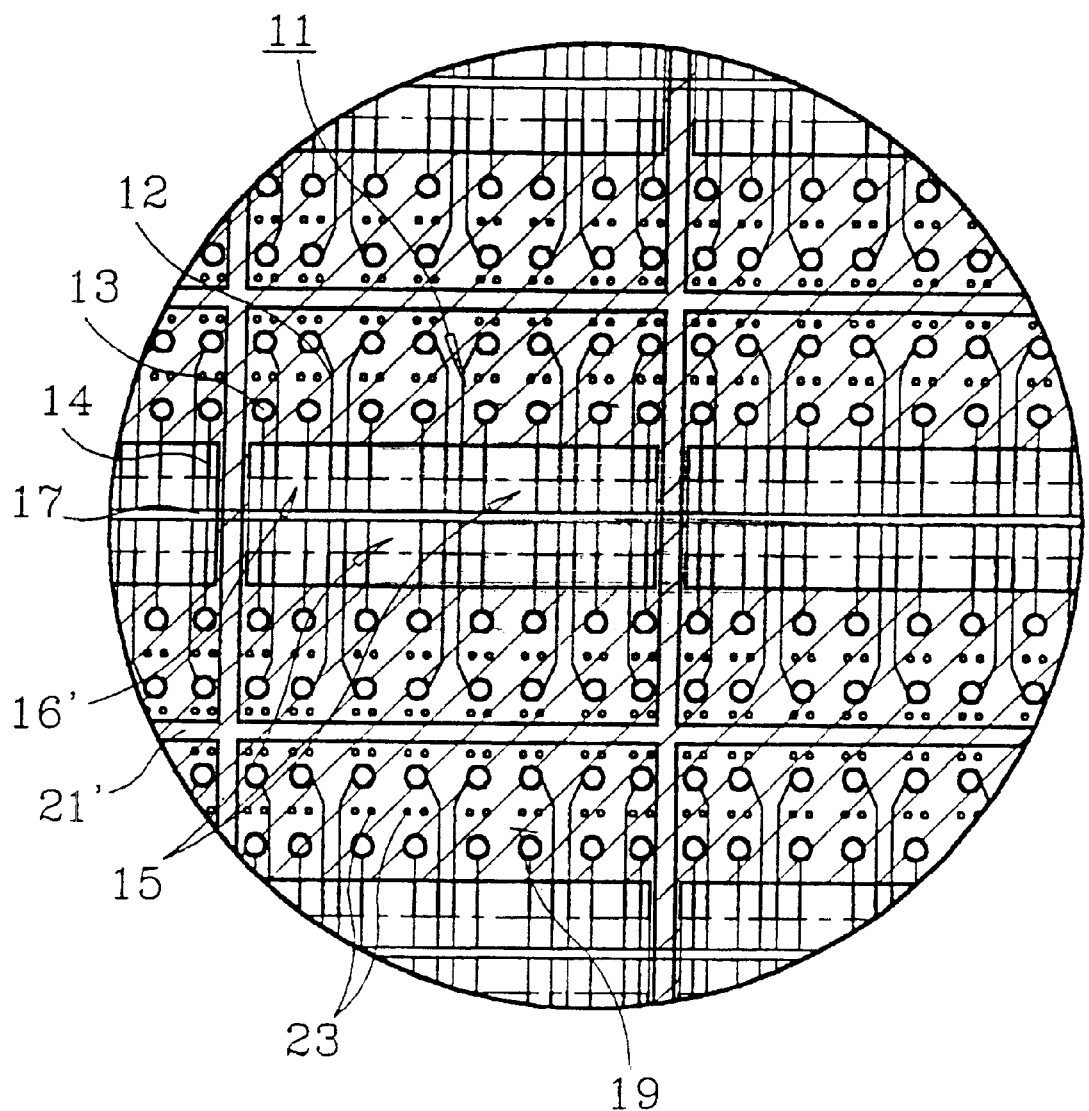
FIG. 1B is a magnified view of the circled portion A in FIG. 1A.

FIG. 1A is a plan view of a circuit pattern tape 10 for semiconductor packages according to a first embodiment of the present invention. FIG. 1B is a magnified view of the circled portion A in FIG. 1A. The first embodiment of the present invention is particularly adapted to eliminate wafer chipping during package singulation, and to prevent or substantially reduce the formation of voids during lamination of the tape to a wafer.

Referring to FIG. 1A, the circuit pattern tape 10 has a circular portion 5 consisting of a plurality of circuit pattern units 11, and a peripheral portion 6 arranged around the circuit portion 5. The circuit portion 5 has the same shape as that of a semiconductor wafer 2 (see FIG. 17A), which consists of a plurality of semiconductor chip units 3.

As shown in FIG. 1B, the circuit pattern tape 10 according to the first embodiment includes, for each circuit pattern unit 11, a separate and distinct circuit pattern. The circuit pattern of each circuit pattern unit 11 includes an opening formation region 16', bond finger formation regions 15 arranged in opposing relationship on opposite sides of the opening formation region 16', respectively, and a plurality of bond fingers 14 arranged in each bond finger formation region 15 and electrically connected to associated die bonding pads 4 of an associated semiconductor chip 3 (see FIG. 17A). The circuit pattern also includes a plurality of solder ball lands 13 arranged outside each bond finger formation region 15 and attached with solder balls 60 (see FIG. 2E), which serve as external input/output terminals of the packages, and a plurality of conductive traces 12, each adapted to electrically connect one of the bond fingers 14 to an associated one of the solder ball lands 13. For each circuit pattern unit 11, the circuit pattern tape 10 also includes an insulating solder mask 19 formed over the entire region of the circuit patterns except for selected openings around the solder ball lands 13, the bond finger formation regions 15, and the opening formation regions 16'. The circuit pattern tape 10 also includes singulation lines 21' that do not intersect either the bond finger formation regions 15 or the opening formation regions 16' of any of the circuit pattern units 11.

The circuit pattern tape 10 of the first embodiment of the present invention includes a variety of features, some of which are also present in other embodiments of the present invention described hereinafter. Following is a brief description of these common features. Features of the embodiments of the invention other than those of the first embodiment will be described in detail in the respective description of those embodiments.

Figure 2A:
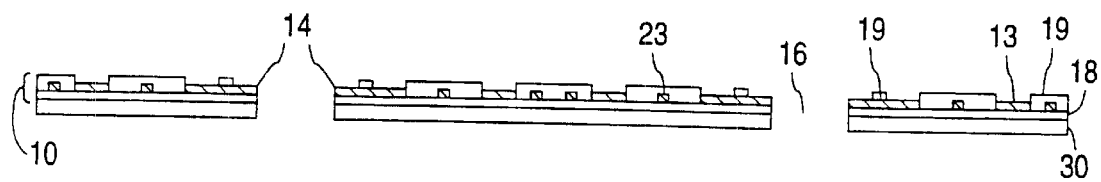
FIGS. 2A through 2F are cross-sectional views respectively illustrating the sequential steps involved in the fabrication of chip size semiconductor packages using the circuit pattern tape of FIG. 1A.
Figure 2B:
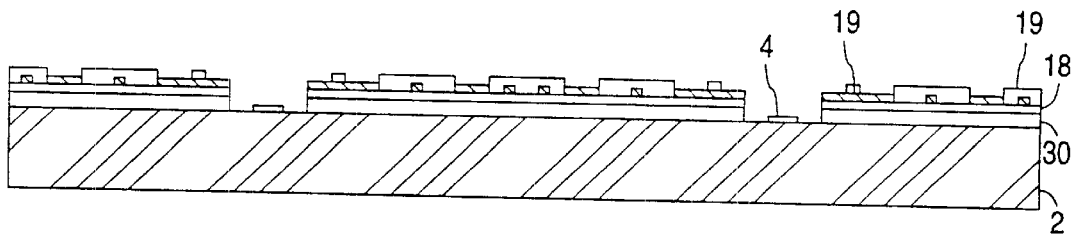
Figure 2C:
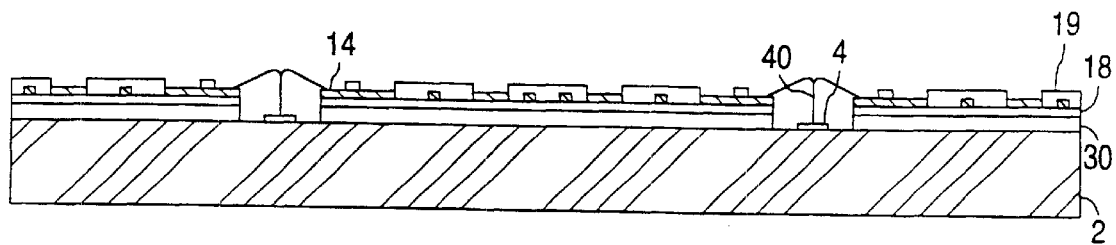
Figure 2D:
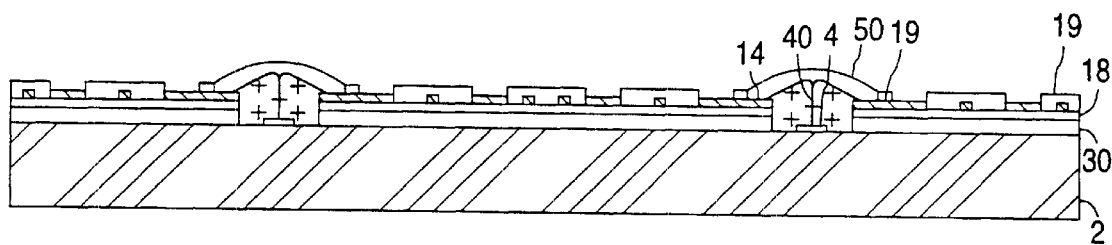

A first feature of the first embodiment of the present invention is adapted to effectively avoid chipping of the wafer during the singulation process, which is conducted after the formation of the resin envelopes 50 (see FIG. 2D). Chipping of the wafer occurs as a result of the difference in the mechanical properties of the resin envelopes and the wafer 2 (see FIG. 2D) to which the circuit pattern tape is laminated, and the concomitant difference in the rotational speed and feed rate of the saw blade necessary to cut through the two materials. The first embodiment of the invention eliminates wafer chipping by arranging the bond finger formation regions 15 and opening formation regions 16' of all of the circuit pattern units 11, and hence, the regions in which the resin envelopes 50 are formed, so that they do not intersect any of the singulation lines 21'. As a result of this arrangement, it is unnecessary to saw through the resin envelopes to singulate the wafer-tape assembly, and hence, a saw speed and feed rate can be adopted for singulation that are sufficient to cut through only the circuit pattern tape and the wafer, and which may therefore be optimized to avoid chipping of the wafer during singulation.

The second feature of the first embodiment of the present invention is adapted to effectively prevent or substantially reduce the formation of voids between the circuit pattern tape and a semiconductor wafer during the lamination of the former to latter. This is achieved by forming first "dummy patterns" on the tape that are adapted to provide a uniform distribution of the conductive metal used for the formation of the solder ball lands 13, the conductive traces 12, and the bond fingers 14, thereby minimizing the difference in thermal expansion per unit area in adjacent portions of each circuit pattern unit.

A so-called "dummy pattern" is a circuit pattern that has no electrical function because it is not electrically connected to any semiconductor chips or solder ball lands 12, even though it is made of the same conductive metal as the circuit pattern traces. In accordance with the present invention, such a dummy pattern may have a structure comprising a plurality of uniformly arranged micro-disks 23, such as those illustrated in FIG. 1B, or alternatively, a structure comprising a plurality of linear traces (not illustrated) having the same shape as the conductive traces 12 in the circuit pattern units, or a combination thereof. The dummy pattern serves to reduce, or offset, the uneven distribution of the conductive metal (namely, the solder ball lands 13, the conductive traces 12, and the bond fingers 14), which has a higher thermal coefficient of expansion than that of the solder mask 19, over the surface of the circuit pattern units, thereby considerably reducing the formation of voids caused by the relatively large difference in the amount of thermal expansion or contraction exhibited between local regions in the circuit pattern tape 10 when the circuit pattern tape 10 is subjected to a large change in temperature, such as during cooling of the assembly after lamination of the tape 10 to the wafer 2.

For simplicity of description, only the remaining features of this invention associated with FIGS. 1A and 1B will now be described, while the remaining features will be described in conjunction with the other figures associated therewith.

In FIG. 1B, the reference numeral 17 denotes bus lines, which are conductive metal lines formed on the tape 10 for the purpose of plating the solder ball lands 13 and the bond fingers 14 with certain conductive metals. For this purpose, each bond finger 14 is temporarily electrically connected at one end thereof to an associated one of the bus lines 17 by means of a conductive trace.

Referring to FIG. 1A, the circuit pattern tape 10 has a circular central portion 5, comprising a plurality of circuit pattern units 11, and a square or rectangular peripheral portion 6 arranged around the circular portion 5. A second "dummy pattern" 24 may be selectively arranged around the periphery of the circular portion 5. The second dummy pattern 24 serves to minimize the difference in the amount of thermal expansion and exhibited in a radial direction between the conductive metal of the circuit pattern elements and the underlying chip units. Similar to the first dummy pattern, the second dummy pattern 24 may also have a structure comprising a plurality of uniformly arranged metal elements 23 having the form of micro-disks, a structure comprising a plurality of linear traces (not illustrated) having the same shape as the conductive traces 12, or a combination thereof. The second dummy pattern 24 is covered by the solder mask 19.

Although the above-described first embodiment of the circuit pattern tape 10 of the invention has been described as comprising only the conductive circuit patterns and the solder mask 19 laminated over the circuit patterns, the present invention is not limited thereto. In accordance with another embodiment of the present invention, a flexible insulating layer 18, preferably, a polyimide layer, may be formed below the circuit patterns. A core layer, for example, a thin, metal layer, or a thin, glass-epoxy layer, may also be selectively formed below the flexible insulating layer 18. Alternatively, a thin glass-epoxy layer may be formed directly below the circuit patterns in place of the flexible insulating layer 18.

The circuit pattern tape 10 of FIG. 1A according to the first embodiment of the present invention has a square or rectangular shape. The circuit pattern units 11 are centrally arranged on the circuit pattern tape 10 to form the circular portion 5, which has the same size and shape as a semiconductor wafer to which the circuit pattern tape 10 is to be attached. Thus, no circuit pattern units 11 are formed in the peripheral portion 6 arranged around the circular portion 5. Instead, a thin, planar metal layer (not shown) of the same metal used to form the circuit patterns, is formed on the peripheral portion 6. A "frame" portion 7 is arranged at the outer periphery of the peripheral portion 6.

At least one bowing-prevention element 35 may be selectively formed at the peripheral portion 6 of the tape between the circular portion 5 and the frame portion 7. The thin metal layer does not extend into the bowing-prevention elements 35. Thus, the bowing-prevention elements 35 prevent or substantially reduce the bowing phenomenon of the circuit pattern tape 10 caused by the relatively large difference in thermal expansion or contraction occurring between the thin metal layer and the flexible insulating layer, such as the underlying solder mask 19 or a polyimide layer, as a result of a change in the temperature of the tape. Although the individual and combined shapes of the bowing-prevention elements 35 are not otherwise limited, there are several bowing-prevention element 35 shapes that are effective to prevent bowing of the laminated wafer-tape assembly. One of these is the arcuate-segment shape shown in FIG. 1A.

An identification mark attachment region 33 may also be defined on a part of the bowing-prevention elements 35. The recognition mark attachment region 33 also serves as a bowing-prevention element. A bar code may be printed in the region 33 as an identification mark.

At least one bus bar 29 may also be provided. Where there are two or more bowing-prevention elements 35, one or more bus bars 29 may be provided in such a fashion that each of the bus bars 29 is arranged between adjacent bowing-prevention elements 35. On the other hand, where there is only one bowing-prevention element 35, a single bus bar 29 may be arranged between opposite ends of the bowing-prevention element 35. The bus bars 29 serve as wide current paths between the separated areas of the thin, planar metal layer, and thereby prevent an "over-plating" of the conductive films plated on the bond fingers 14 and the solder ball lands 13 of each circuit pattern caused by increase in the current density in the metal lines forming the circuit pattern due to the presence of the bowing-prevention elements 35.

A plurality of microscopic through-holes 25 are formed through the solder mask 19 at the peripheral portion 6 of the circuit pattern tape 10 between the bowing-prevention elements 35 and the frame portion 7. The thin, planar metal layer of the tape is upwardly exposed through the microscopic through-holes 25. The microscopic through-holes 25, like the bowing-prevention elements 35, prevent or substantially reduce the bowing of the circuit pattern tape 10 caused by the relatively large difference in thermal expansion/contraction occurring between the thin metal layer and the flexible insulating layer, such as the solder mask 19 or a polyimide layer, with a substantial change in temperature of the tape.

A plurality of bowing-prevention radial grooves 36 may also be formed in the circuit pattern tape 10 at the peripheral portion 6 of the tape, such that the grooves interrupt the otherwise continuous thin metal layer, as shown in FIG. 1A. The radial grooves 36, like the arcuate bowing-prevention elements 35 and the microscopic through-holes 25, serve to prevent or reduce the amount of bowing occurring in a direction orthogonal to the bowing-prevention radial grooves 36, i.e., in the circumferential direction, as well as in the radial direction. In the exemplary embodiment illustrated in FIG. 1A, the thin metal layer on the tape takes on a planar, comb-toothed shape connecting the outer periphery of the circular portion 5 to the frame portion 7 as a result of the grooves 36.

In FIG. 1A, reference numeral 27 denotes test regions for testing the circuit pattern tape 10 of the present invention. The processes involved in the fabrication of semiconductor packages, e.g., resin encapsulation, are not applied to these test regions, or if they are, the packages resulting therefrom are typically discarded.

Heretofore, the features of the present invention have been described in conjunction with FIGS. 1A and 1B. Selected ones of those features will be described again in detail in the description hereafter.

For a better understanding of the present invention, the procedure for fabricating chip size semiconductor packages using the circuit pattern tape of the present invention will now be described in conjunction with FIGS. 2A through 2F.

Figure 2E:
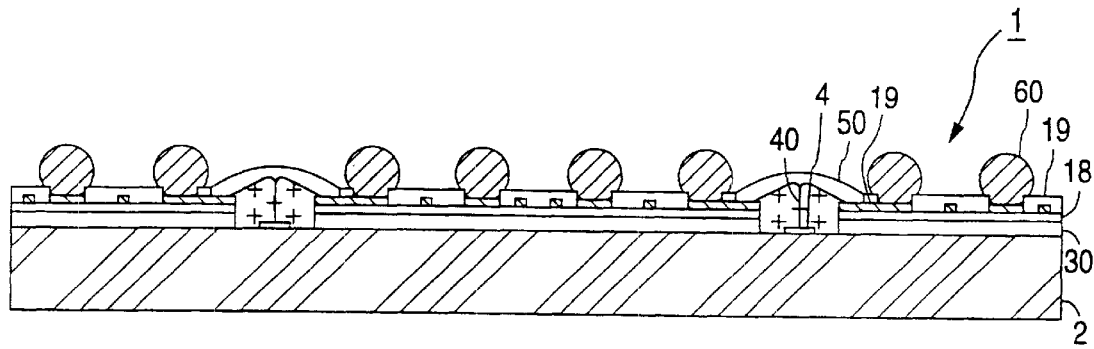
Figure 2F:
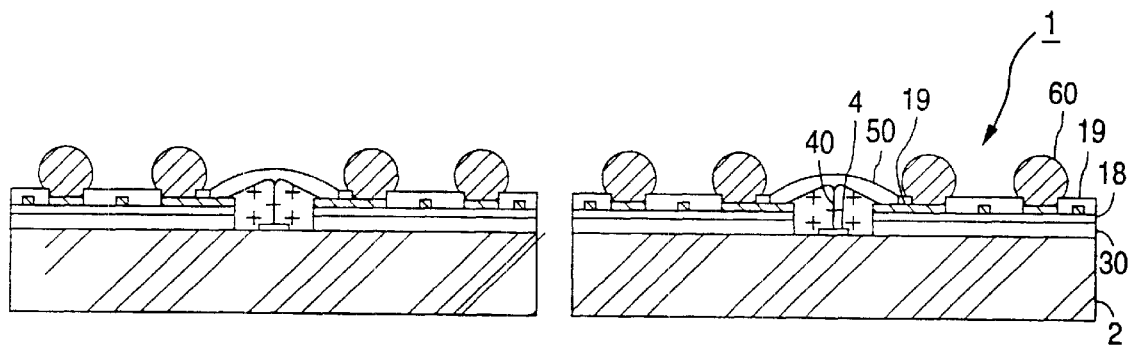

FIGS. 2A through 2F are cross-sectional views respectively illustrating sequential steps in the production of chip size semiconductor packages 1 using the circuit pattern tape 10 of the present invention. FIG. 2A is a partial cross-sectional view showing the structure obtained after forming an adhesive layer 30 on the lower surface of the circuit pattern tape 10, and then perforating openings 16 through it. FIG. 2B is a partial cross-sectional view showing the structure obtained by laminating the perforated structure onto a wafer 2. FIG. 2C is a partial cross-sectional view showing the structure after a wire bonding process is performed using fine, conductive wires 40. FIG. 2D is a partial cross-sectional view showing the structure after encapsulation of the wire bonding regions in protective resin envelopes 50. FIG. 2E is a partial cross-sectional view showing the structure after the attachment thereto of solder balls 60. FIG. 2F is a partial cross-sectional view showing a structure obtained after a singulation process in which the structure shown in FIG. 2E is separated into individual chip size semiconductor packages 1 in accordance with a cutting method, typically a sawing process.

The package fabrication procedure will first be described in conjunction with FIG. 2A. Referring to FIG. 2A, a flexible insulating layer 18, such as a polyimide resin layer, is first prepared as a substrate for the circuit pattern tape 10. Circuit patterns are then formed on the upper surface of the flexible insulating layer 18, each of which includes conductive metal solder ball lands 13, bond fingers 14, and conductive traces 12 that electrically connect associated ones of the solder ball lands 13 and the bond fingers 14 to each other.

A first dummy pattern consisting of a plurality of thin, disk-shaped metal elements 23 may be selectively formed on the upper surface of the flexible insulating layer 18 to prevent the formation of voids between the tape and a wafer to which the tape is laminated, as described above. An insulating solder mask 19 is then formed over the upper surface of the resulting structure, except for openings through which the solder ball lands 13 and bond fingers 14 are exposed. That is, the insulating solder mask 19 covers the entire upper surface of the circuit patterns, except for the solder ball lands 13, the bond fingers 14, and the first dummy pattern.

Parenthetically, it should be understood that the present invention is not limited to the above-described structure for the circuit pattern tape 10. As previously mentioned, the flexible insulating layer 18, which is preferably a polyimide layer, may be eliminated. A core layer, for example, a thin metal or glass-epoxy layer, may also be formed beneath the flexible insulating layer 18. Alternatively, a thin glass-epoxy layer may be formed directly beneath the circuit patterns, in place of the flexible insulating layer 18. It should be understood that all of the above structures are intended to be included in the scope of this invention.

An adhesive layer 30, such as a double-sided adhesive tape, is then formed or placed on the entire lower surface of the circuit pattern tape 10. Thereafter, the circuit pattern tape 10 is perforated at its opening formation regions 16' (see FIG. 1B) using a perforating means, such as a laser or a mechanical punch, thereby forming openings 16.

FIG. 2B is a cross-sectional view showing the structure obtained by laminating the circuit pattern tape 10 of FIG.

2A, previously punched with the openings 16, on a semiconductor wafer 2 by means of the adhesive layer 30. As shown in FIG. 2B, the die pads 4 on each semiconductor chip unit 3 (see FIG. 17A) of the wafer 2, which serve as input/output terminals of the respective chips 3, are arranged in an associated one of the openings 16 such that they face upwardly through the opening.

FIG. 2C is a cross-sectional view of the structure obtained after wire bonding of the bond fingers 14 of the circuit pattern tape 10 to associated die pads 4 of the wafer by means of fine bonding wires 40 made of, e.g., gold, aluminum, or an alloy thereof, because of their superior electrical conductivity.

FIG. 2D is a cross-sectional view showing the structure obtained after dispensing a liquid encapsulating material, for example, a liquid epoxy resin, into the regions defined by the side surfaces of associated ones of the openings 16, the upper surface portion of the wafer carrying the die pads 4 that is exposed through the opening 16, and the side walls of the opening in the solder mask 19 that exposes the bond fingers 14, and then curing the dispensed liquid epoxy resin, thereby forming resin envelopes 50. The resin envelopes 50 serve to protect the die pads 4, the bond fingers 14, and the bonding wires 40 from harmful physical, chemical, and electrical environmental elements.

FIG. 2E is a cross-sectional view showing the structure obtained after formation of external input/output terminals, such as the solder balls 60 illustrated, on the wafer-tape assembly, following the formation of the resin envelopes 50. A plurality of connected semiconductor packages 1, each a complete structure, are thus formed in the wafer-tape assembly.

FIG. 2F is a cross-sectional view of two individual chip size semiconductor packages 1 after their separation from the wafer 2 following a singulation process using a cutting method.

Figure 3A:
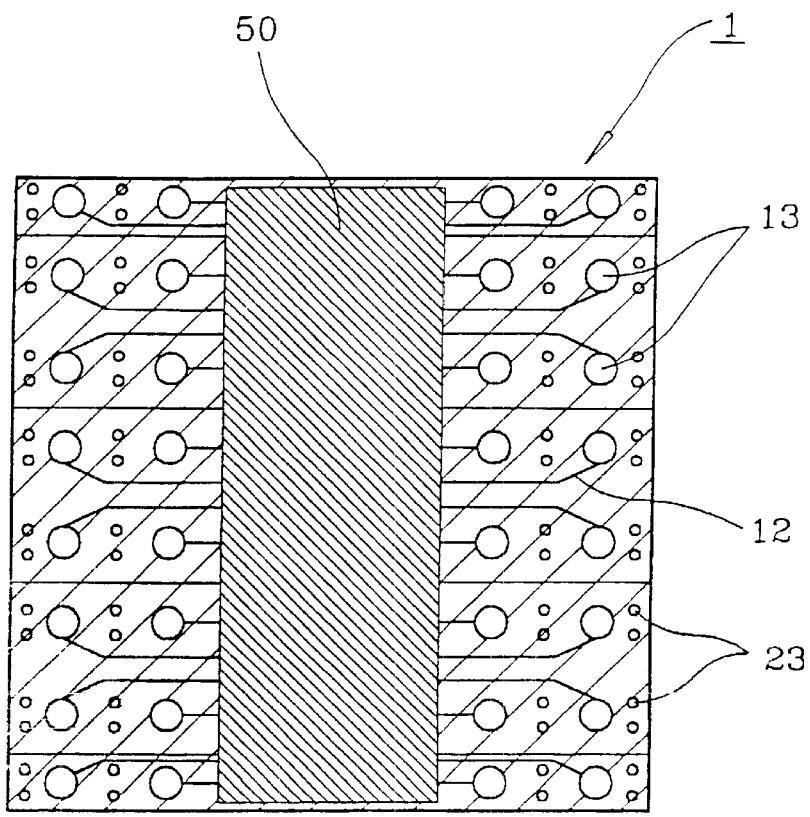
FIG. 3A is a plan view of a semiconductor package fabricated in accordance with the sequential fabrication procedure illustrated in FIGS. 2A through 2F.
Figure 3B:
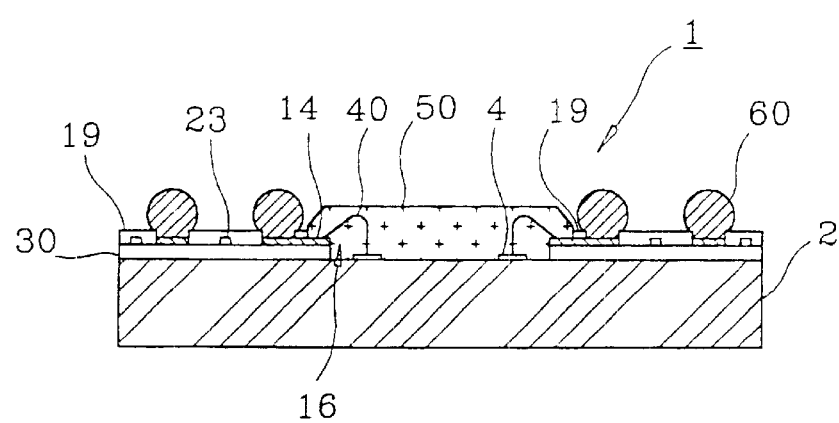
FIG. 3B is a cross-sectional view of the semiconductor package shown in FIG. 3A.

FIG. 3A is a plan view of a semiconductor package 1 fabricated in accordance with the fabrication procedure shown in FIGS. 2A to 2F. FIG. 3B is a cross-sectional view of the package 1 shown in FIG. 3A.

As shown in FIG. 3A, none of the edges of the chip size semiconductor package 1 obtained after its singulation from the wafer extend into or coincide with the edges of its resin envelope 50. By virtue of this, chipping of the wafer during the singulation process as described above is virtually eliminated. Accordingly, it is possible to greatly reduce or completely eliminate the formation of cracks at the singulation surfaces of the semiconductor package 1, and hence, the penetration of moisture or other harmful substances through the cracks, and the resulting possibility of an inoperative or malfunctioning semiconductor package 1.

The plurality of thin, disk-shaped metal elements 23, which form the first dummy pattern, are disposed in a region of the circuit pattern unit where no metal layer otherwise exists, except for the adjacent solder ball lands 13, each of which is made of the conductive metal and has a relatively large area. By virtue of the presence of the first dummy pattern on the circuit pattern units, it is possible to reduce the large difference in area between the metallized and the unmetallized portions of the circuit pattern units. The first dummy pattern thus serves to reduce or minimize the difference in thermal expansion exhibited between local regions in the circuit pattern tape 10 when it is laminated to the wafer 2 at a relatively high temperature, then cooled back to room temperature, thereby effectively reducing the formation of voids between the tape and the wafer.

Figure 4A:
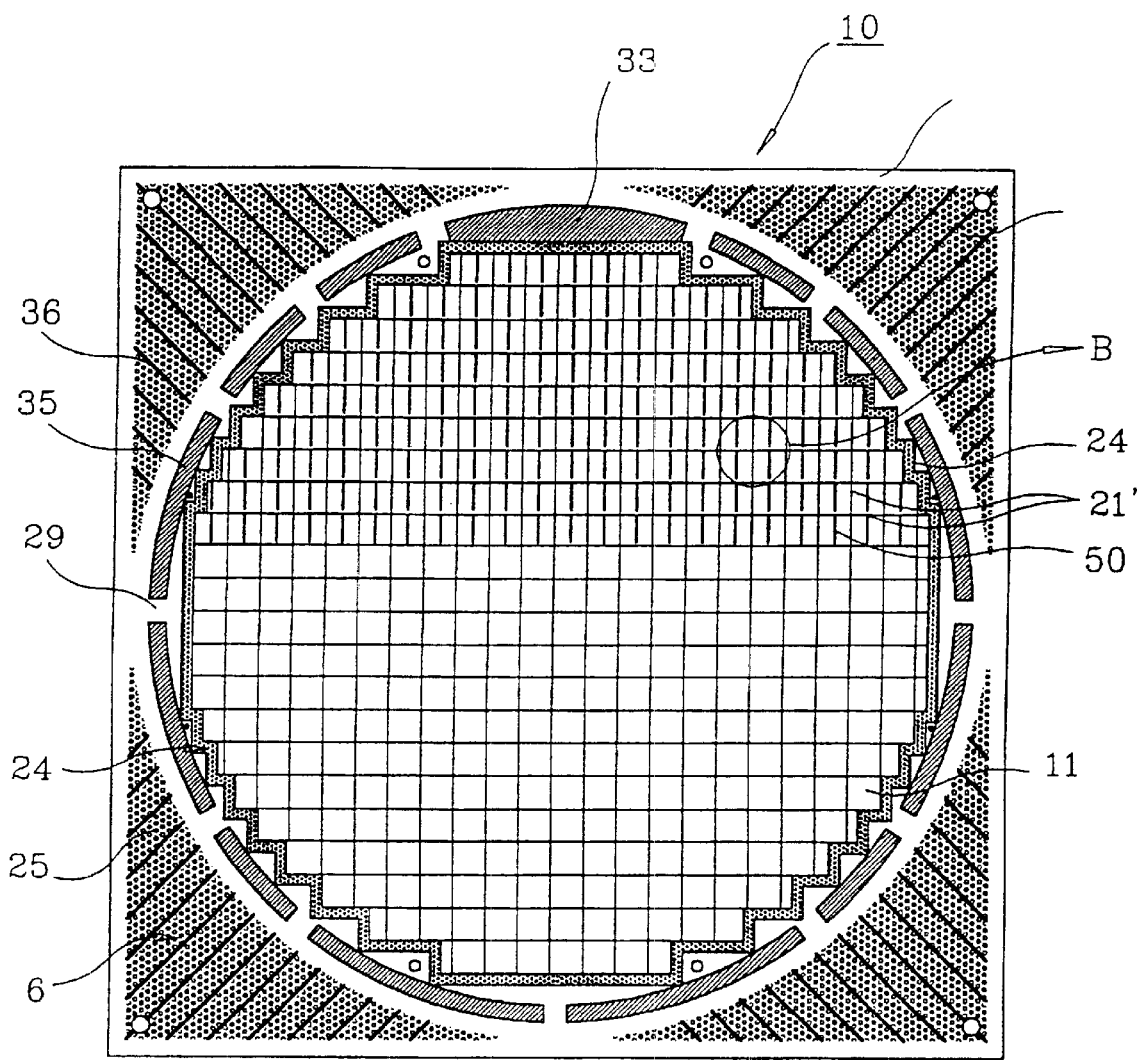
FIG. 4A is a plan view of a wafer-tape assembly formed by laminating the circuit pattern tape of FIG. 1A onto the semiconductor wafer of FIG. 17A, then applying a packaging process to the laminated assembly to form a plurality of connected chip size semiconductor packages, but before the singulation process.
Figure 4B:
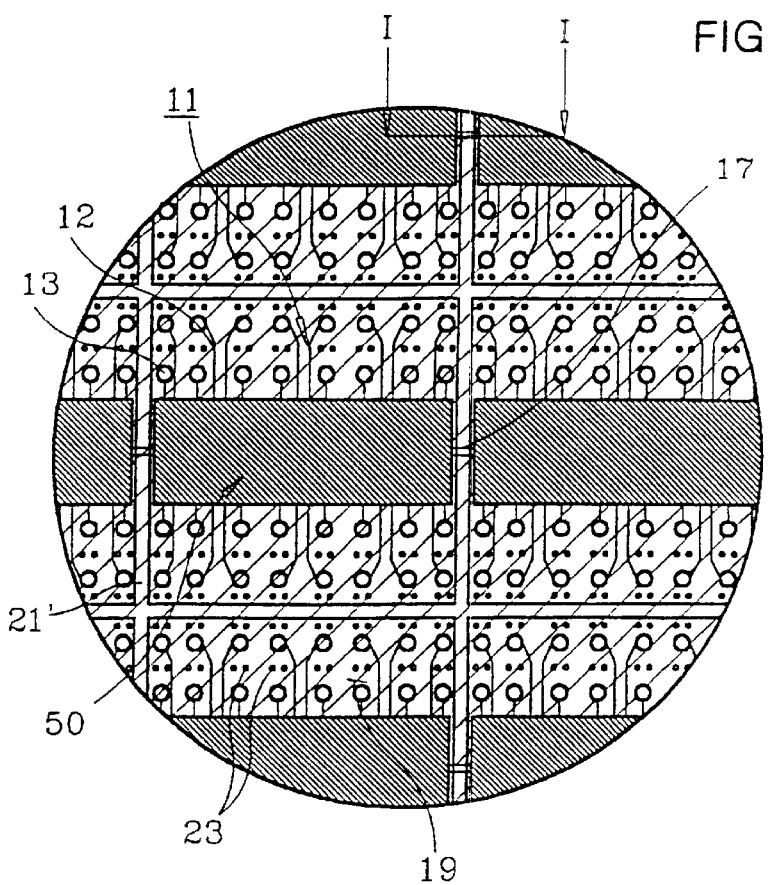
FIG. 4B is a magnified view of the circled portion B shown in FIG. 4A.
Figure 4C:
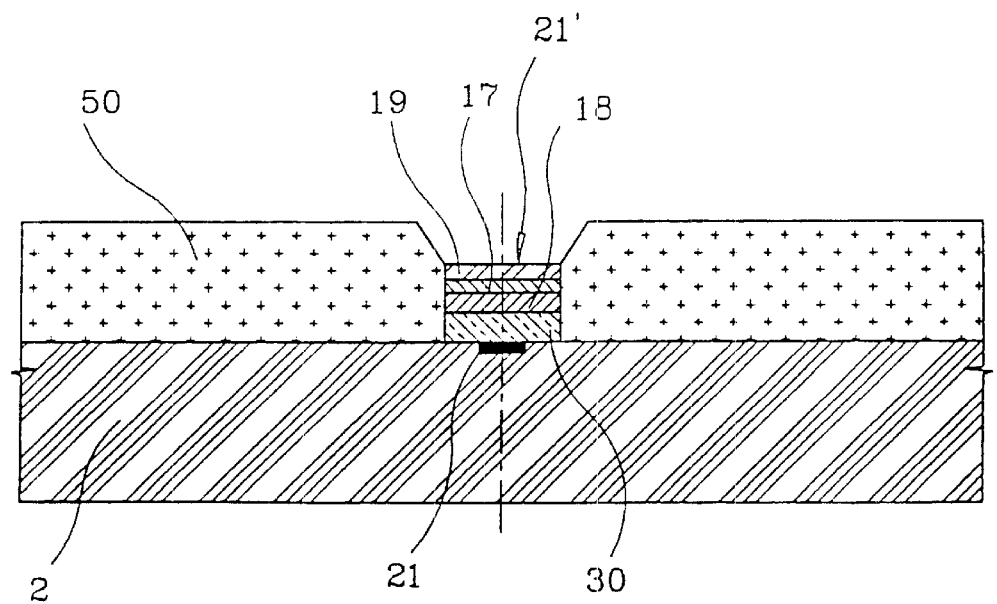
FIG. 4C is a cross-sectional view taken along the line I—I in FIG. 4B.
Figure 17A:
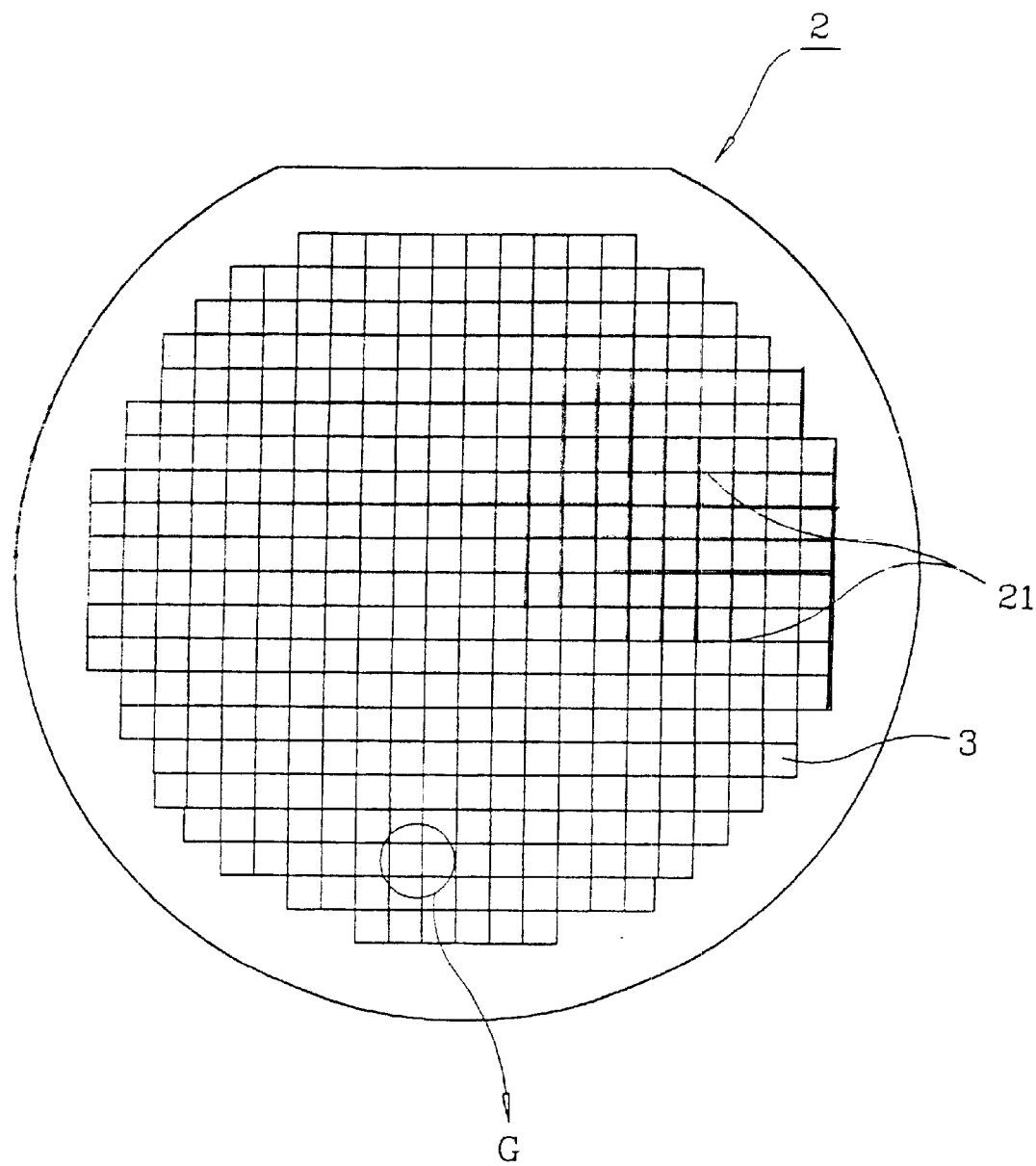
FIG. 17A is a plan view of a typical semiconductor wafer having a plurality of semiconductor chip units in it.
Figure 17B:
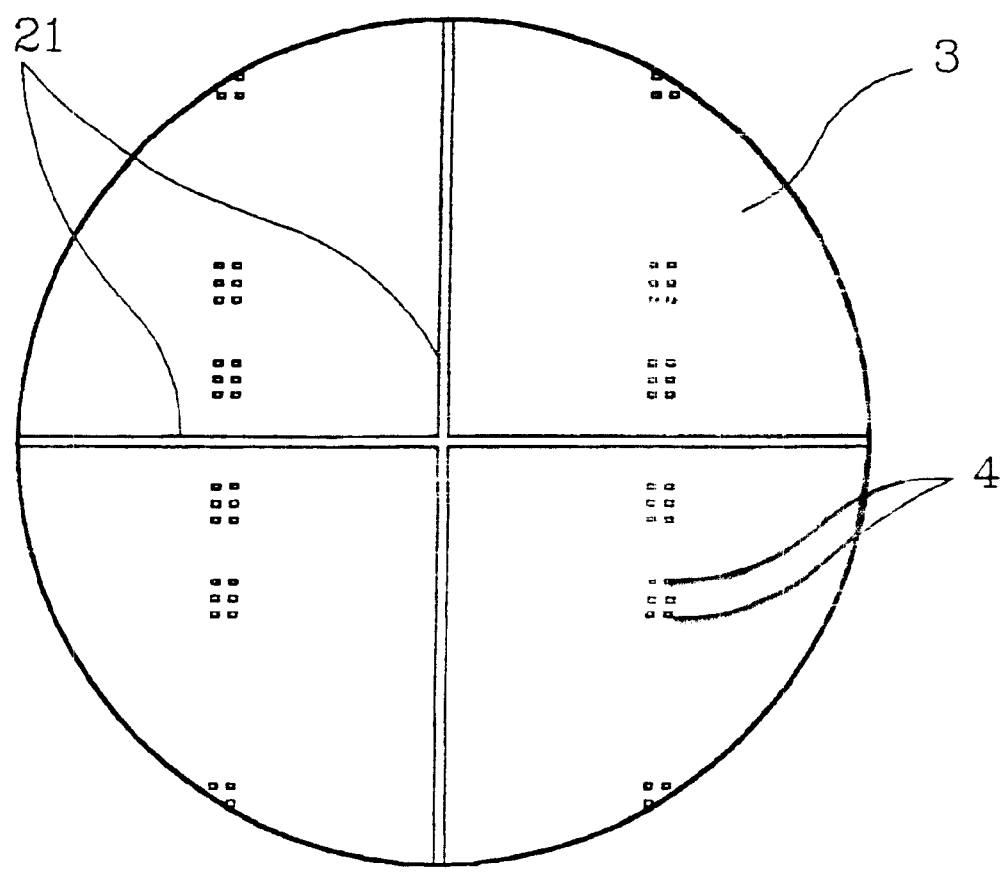
FIG. 17B is a magnified view of the circled portion G of the wafer in FIG. 17A.
Figure 18A:
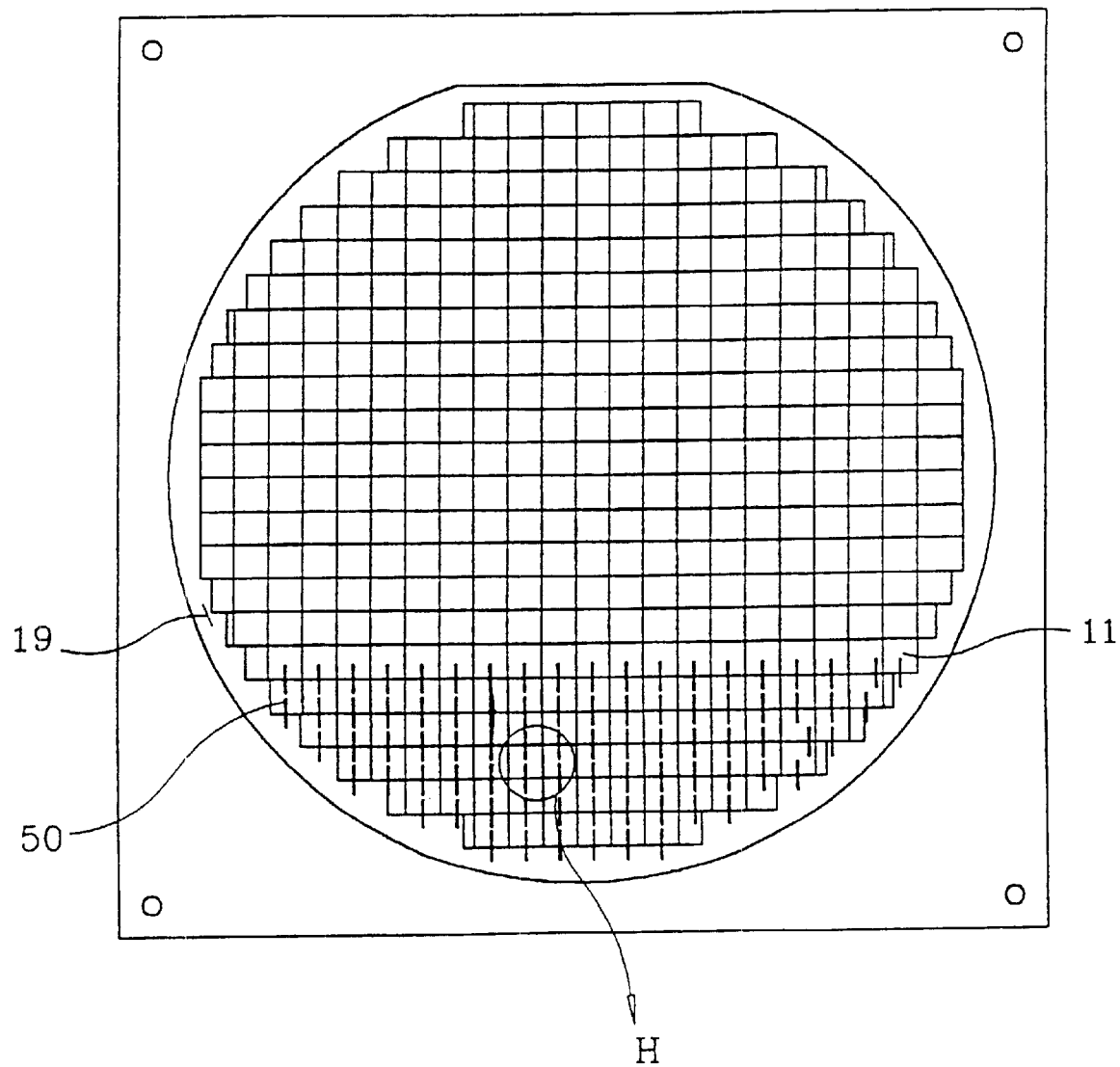
FIG. 18A is a plan view of a wafer structure obtained prior to a singulation process by laminating the conventional circuit pattern tape of FIG. 16A onto the wafer of FIG. 17A, and then performing a packaging process on the wafer-tape assembly to forming a plurality of connected, chip size semiconductor packages.
Figure 18B:
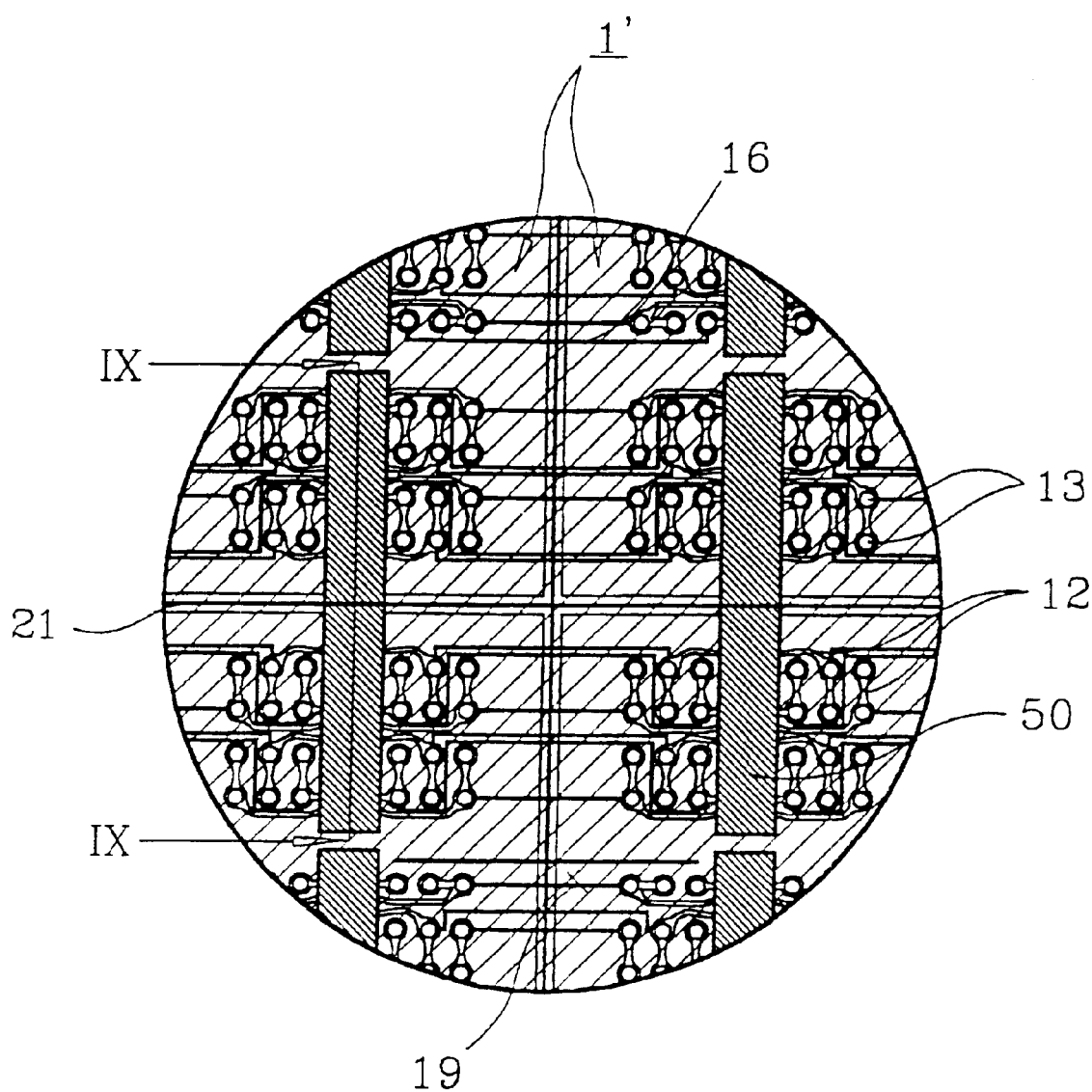
FIG. 18B is a magnified view of the circled portion H of the wafer-tape assembly of FIG. 18A.
Figure 18C:
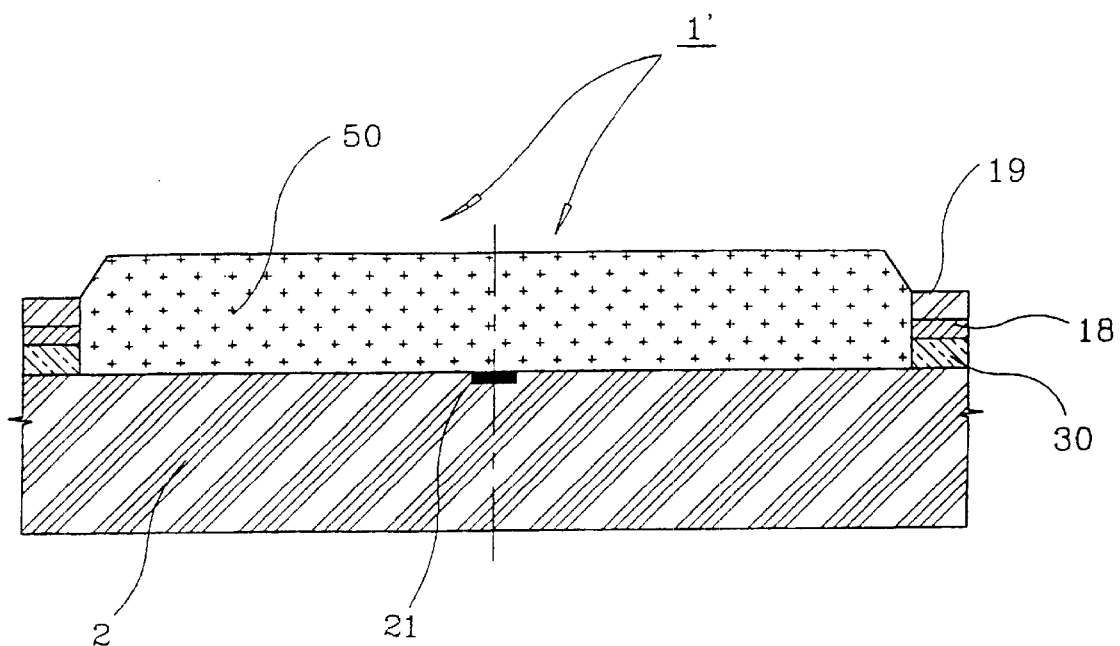
FIG. 18C is a cross-sectional view of the wafer-tape assembly taken along the line IX—IX of FIG. 18B; and, FIG. 19 is a cross-sectional view of a conventional semiconductor packages fabricated using the conventional circuit pattern tape shown in FIG. 16A.
Figure 19:
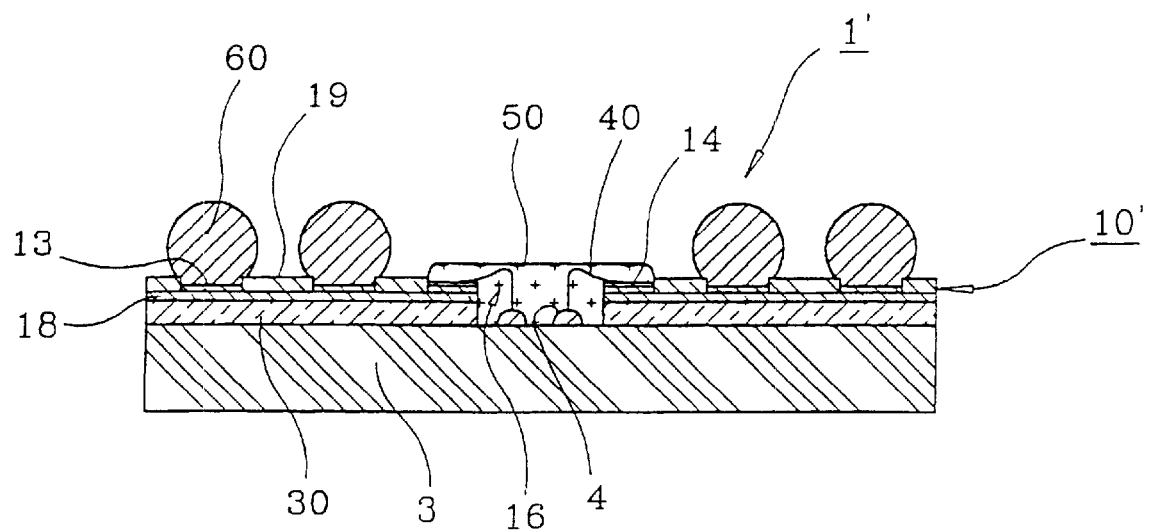

FIG. 4A is a plan view of the wafer-tape assembly obtained by laminating the circuit pattern tape 10 of FIG. 1A onto the wafer 2 of FIG. 17A and then performing a packaging process on the assembly to form a plurality of completed chip size semiconductor packages 1 therein, but before any singulation thereof. FIG. 4B is a magnified view of the circled portion B shown in FIG. 4A. FIG. 4C is a cross-sectional view of the assembly taken along the line I—I in FIG. 4B. Referring to FIGS. 4A through 4C, it will be seen that the resin envelopes 50 are arranged within respective encapsulation regions on associated chip size semiconductor packages 1, and that the resin envelopes 50 do not intersect or overlap any of the singulation lines 21' at any point.

Therefore, where a plurality of chip size semiconductor packages 1 are fabricated using the circuit pattern tape 10 according to the first embodiment of the present invention, it is unnecessary to cut through any of the resin envelopes 50 during the singulation process, and only the adhesive layer 30, the bus lines 17, the solder mask 19, and/or a flexible insulating layer 18, and/or a core layer, all of which exhibit a rupture strength less than that of the semiconductor wafer 2, need be cut in the singulation process. Accordingly, it is unnecessary to adopt a high saw blade rotation speed or feed rate necessary to cut the stronger material of the resin envelopes 50, and the optimum blade speed and feed rate needed to cut the wafer 2 without chipping it can be adopted. As a result, chipping of the wafer 2 during singulation, as well as the resulting formation of cracks, is virtually eliminated. In the embodiment illustrated in FIG. 4C, the circuit pattern tape 10 has a flexible insulating layer 18 at its lower surface, and the dotted line represents the line along which the wafer 2 is cut by the saw blade during the singulation process.

Figure 5A:
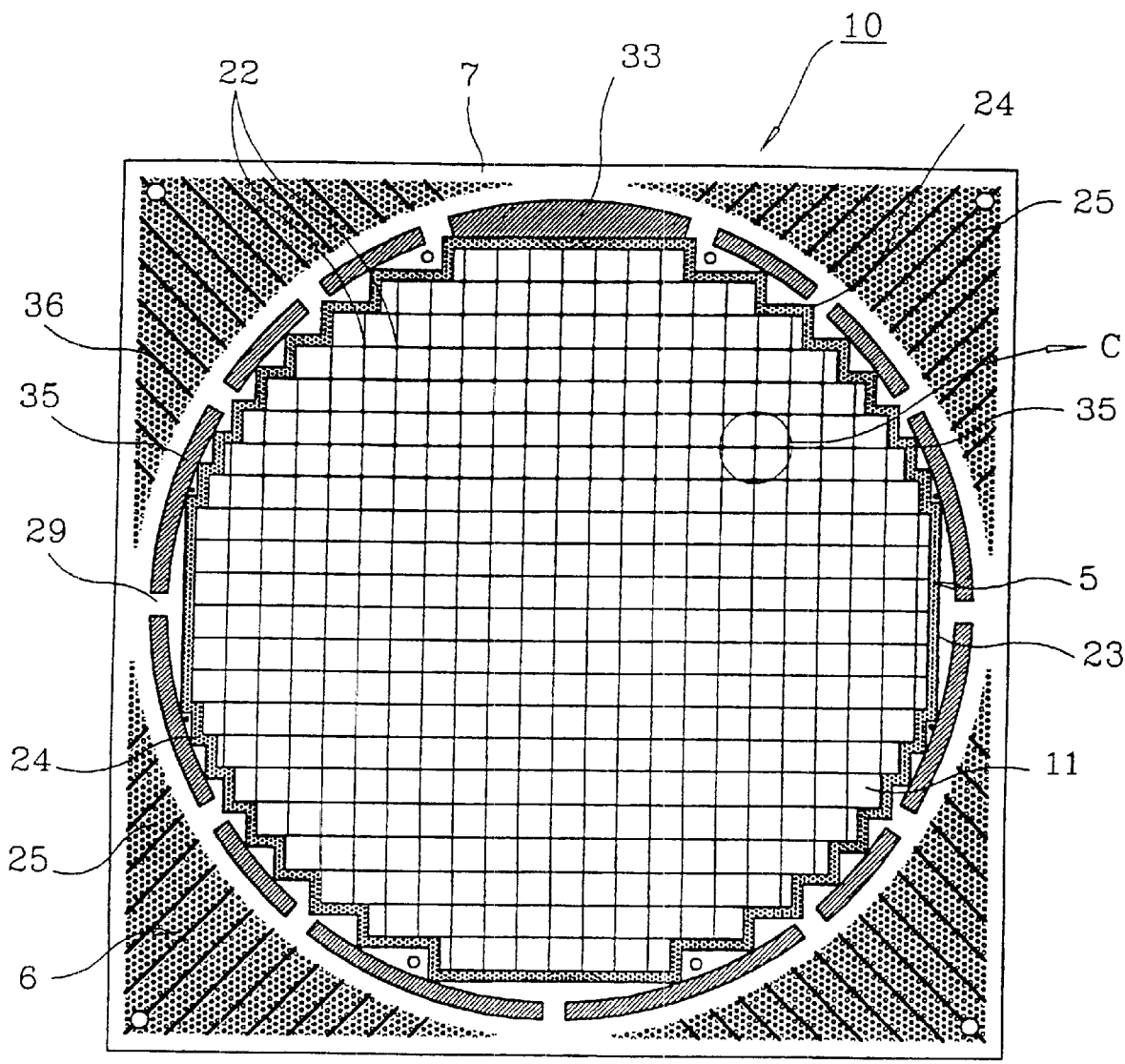
FIG. 5A is a plan view of a circuit pattern tape for semiconductor packages according to a second preferred embodiment of the present invention.
Figure 5B:
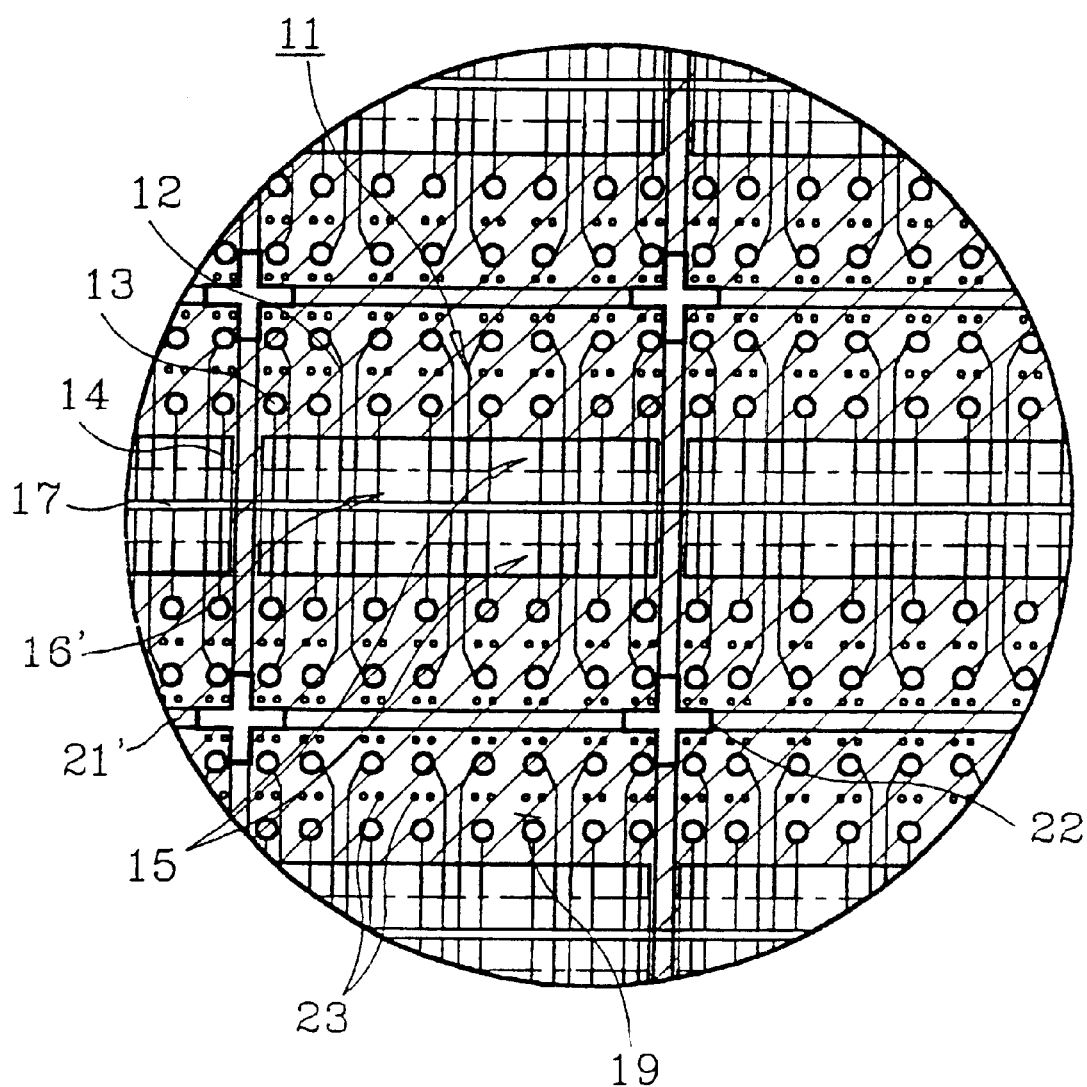
FIG. 5B is a magnified view of the circled portion C in FIG. 5A.

FIG. 5A is a plan view of a circuit pattern tape 10 for production of chip size semiconductor packages according to a second preferred embodiment of the present invention. FIG. 5B is a magnified view of the circled portion C of the tape shown in FIG. 5A. The second embodiment of the present invention is particularly adapted to locate singulation lines precisely on the laminated wafer-tape assembly for the purpose of consistent, accurate singulation of chip size semiconductor packages from the wafer assembly.

The second embodiment of the circuit pattern tape 10 shown in FIGS. 5A and 5B has the same general structure as the first embodiment of the circuit pattern tape 10 shown in FIGS. 1A and 1B, except that singulation line locating holes 22 are provided at each intersection of the singulation lines 21'. It may be noted that, at each such intersection, at least two, and typically, four adjacent circuit pattern units 11 typically join together at one each of their four corners.

Although the locating holes 22 are shown in the form of points at the respective intersection of singulation lines 21' to locate those singulation lines 21 on the wafer 2, the present invention is not limited to that particular form of this feature. For example, slots may be formed on four sides of a square or rectangle defined by four crossing singulation lines 21' to locate the corresponding singulation lines 21 on the wafer. Alternatively, both holes and slots can be used in combination with each other to locate the singulation lines 21. All of these configurations are intended to be included in the scope of the invention.

It may be seen that no circuit pattern extends below any singulation line locating hole 22 because the singulation lines 21' themselves pass outside, and serve to define the boundaries of, the circuit pattern units. When the circuit pattern tape 10 of the second embodiment of the present invention includes only a solder mask 19 and the circuit patterns, or when it includes the solder mask 19, the circuit patterns, and a flexible insulating layer 18, such as a semitransparent polyimide layer, laminated to each other, the solder mask 10 may be opened up at positions corresponding to the singulation line locating holes 22 to form them. However, the present invention is not limited to that particular configuration. For example, when the circuit pattern tape 10 has a structure including the solder mask 19, the circuit patterns, and the flexible insulating layer 18, such as a semitransparent polyimide layer, both the solder mask 19 and the flexible insulating layer 18 may be perforated to create the locating holes 22.

If necessary or desirable for any reason, even the adhesive layer 30 (see FIG. 2A), such as a double-sided adhesive tape attached to the lower surface of the circuit pattern tape 10, may be perforated to define the singulation line locating holes 22. Alternatively, when the circuit pattern tape 10 includes a solder mask 19, circuit patterns, a semitransparent flexible insulating layer 18, and a core layer laminated to each other, all of these layers may be perforated to form the singulation line locating holes 22.

On the other hand, if the core layer is comprised of a thin, semitransparent glass-epoxy layer (and not a thin, opaque metal layer), only the solder mask 19, or both the solder mask 19 and the flexible insulating layer 18 need be perforated. Thus, in accordance with the second embodiment of the invention, the form of the singulation line locating holes 22 is fairly unlimited in terms of their shape and the kinds and numbers of the layers perforated to form them, so long as they serve to accurately locate the singulation lines 21 on the wafer 2 (see, e.g., FIGS. 6B and 6C).

Figure 6A:
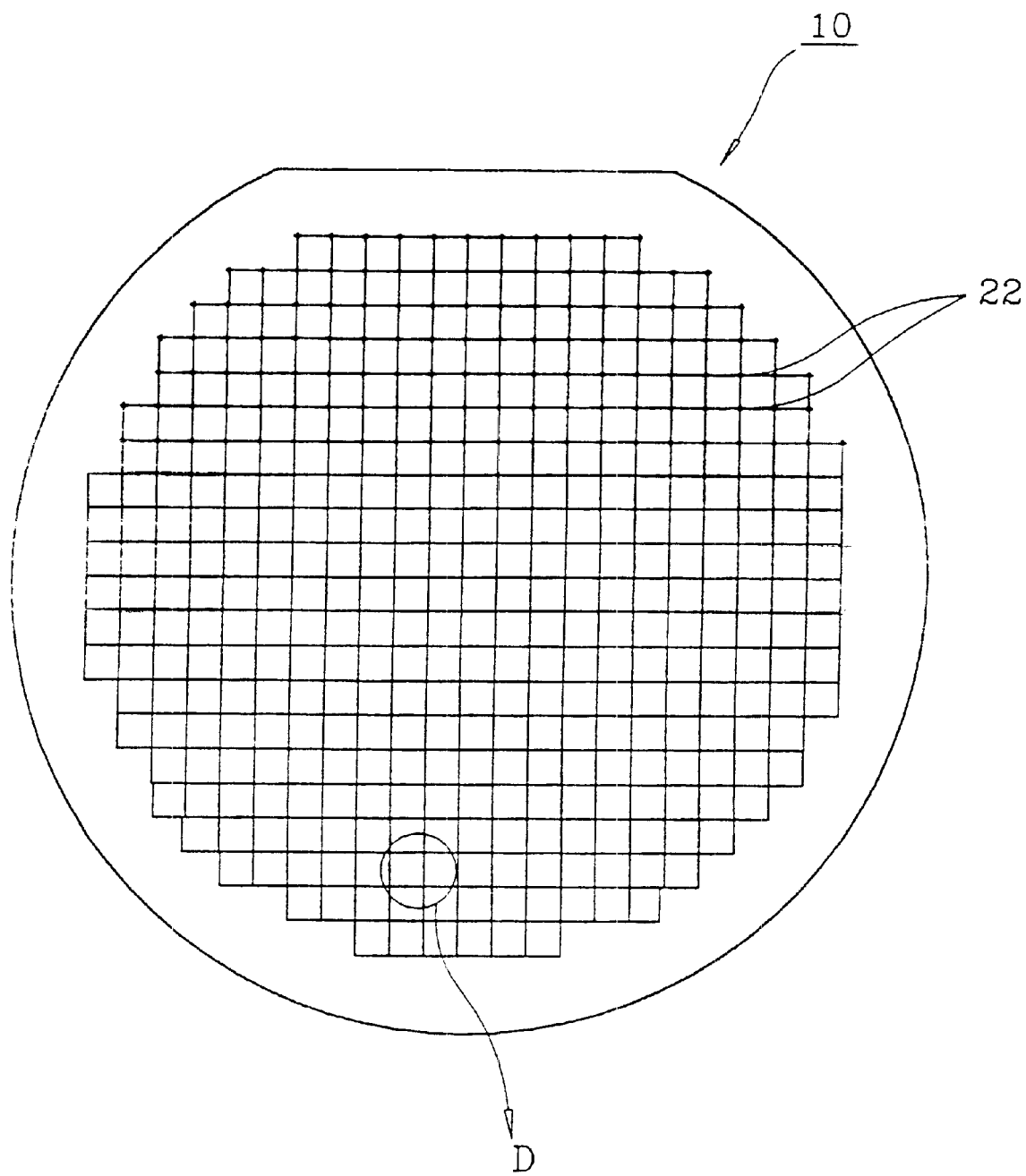
FIG. 6A is a plan view of a laminated structure obtained after forming openings in the circuit pattern tape of FIG. 5A and then laminating the resulting circuit pattern tape onto the semiconductor wafer of FIG. 17A.
Figure 6B:
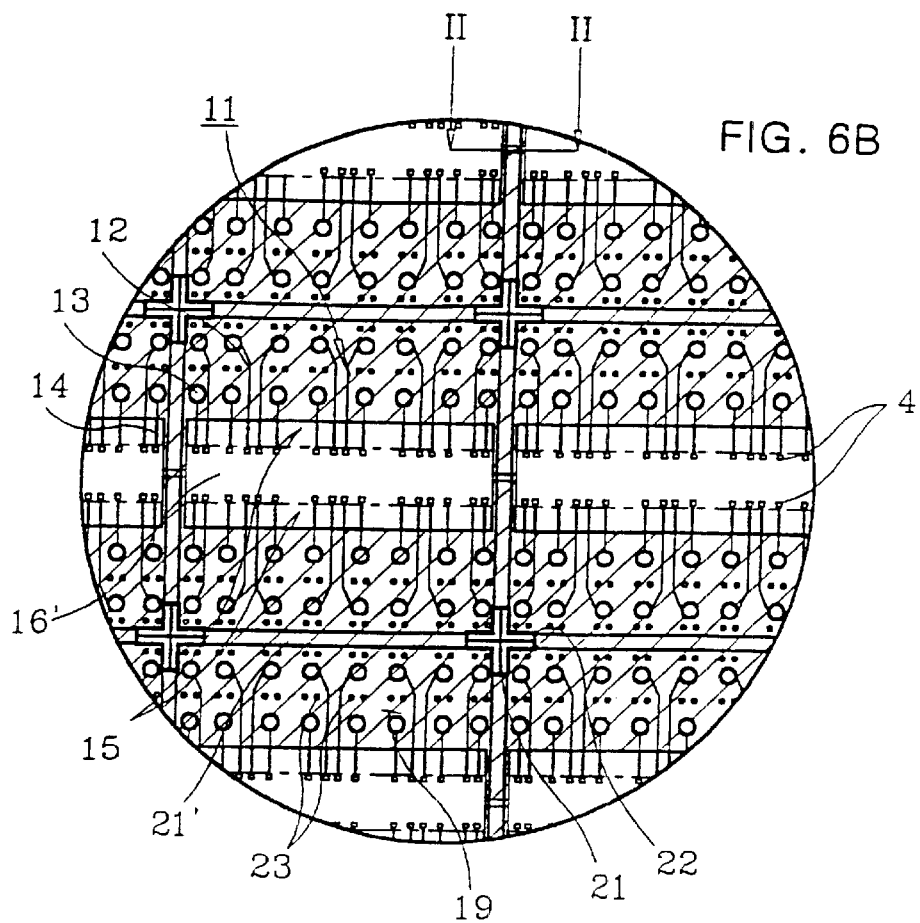
FIG. 6B is a magnified view of the circled portion D of the structure in FIG. 6A.

FIG. 6A is a plan view of the structure obtained by perforating openings 16 in the opening formation regions 16' in the circuit pattern tape of FIG. 5A, and then laminating the resultant circuit pattern tape 10 over the wafer 2 of FIG. 17A. In FIG. 6A, the circuit pattern tape 10 is shown with the peripheral portion 6 having been removed after the wafer-tape lamination. FIG. 6B is a magnified view of the circled portion D in FIG. 6A. Referring to FIG. 6B, a plurality of singulation line locating holes 22, each having a cross shape, are formed. The associated singulation lines 21 on the wafer 2 are upwardly exposed through each singulation line locating hole 22 so that they can be located visually, either manually, or by means of automated optical scanning equipment. In FIG. 6B, the reference numeral 4 denotes die bonding pads on the wafer 2.

Figure 6C:
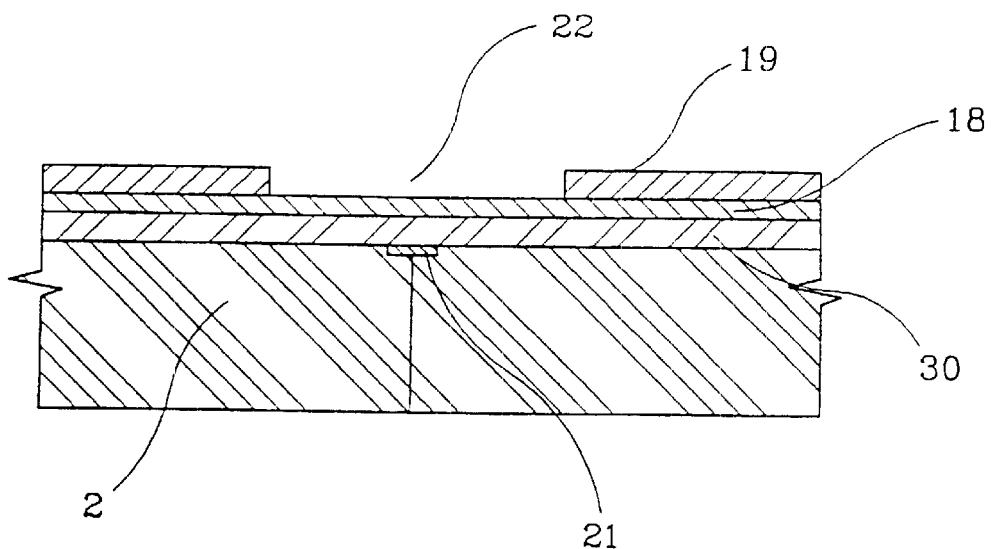
FIG. 6C is a cross-sectional view of the structure taken along the line II—II in FIG. 6B.

FIG. 6C is a cross-sectional view taken along the line II—II of FIG. 6B. FIG. 6C illustrates an embodiment in which the circuit pattern tape 10 includes a flexible insulating layer 18. In the embodiment of FIG. 6C, each singulation line locating hole 22 is defined by the side walls of the solder mask 19 and the upper surface of the flexible insulating layer 18. In this embodiment, it is possible to visually locate the singulation lines 21 on the wafer 2 through the semitransparent flexible insulating layer 18 and the adhesive layer 30 from the top of the assembly.

Since it is possible to accurately locate singulation positions on the wafer 2 even after lamination of the circuit pattern tape 10 to the wafer 2, the operator, or an automated singulation device carrying a visual scanner unit can easily and accurately locate the singulation positions to achieve consistently accurate cutting-apart of the wafer-tape assembly.

FIGS. 7A through 10B respectively illustrate alternative embodiments of circuit pattern tapes 10, each of which has at least one bowing-prevention element 35, in accordance with a third preferred embodiment of the present invention. Each of the circuit pattern tapes 10 shown in FIGS. 7A through 10B is particularly adapted to effectively prevent or substantially reduce bowing of the wafer-tape assembly during the high temperature lamination process, or during subsequent fabrication processes, that is caused by the use of materials having dissimilar thermal coefficients of expansion.

Figure 7A:
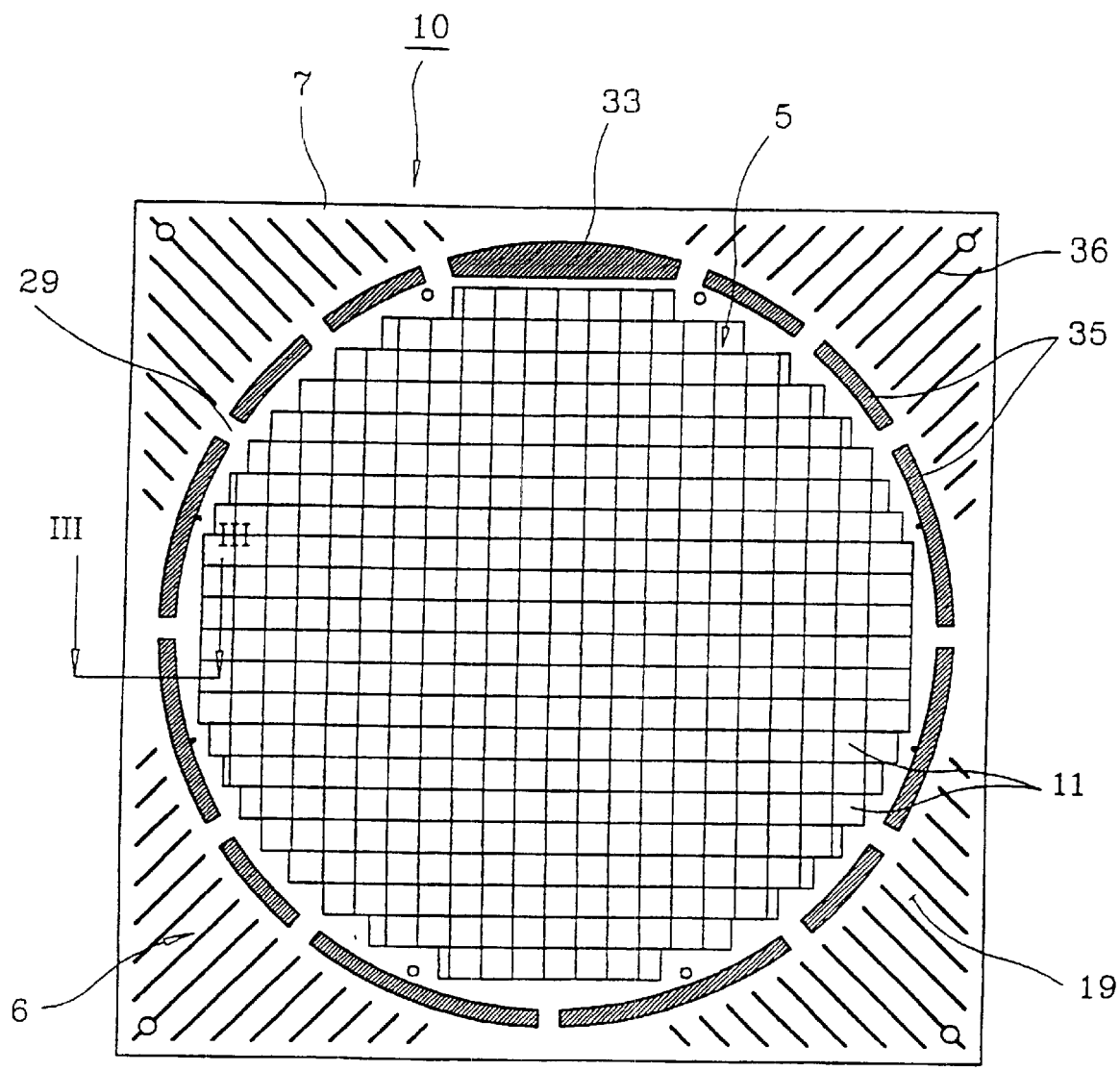
FIG. 7A is a plan view of a circuit pattern tape for semiconductor packages according to a first example of a third preferred embodiment of the present invention in which at least one bowing-prevention element is provided.
Figure 7B:
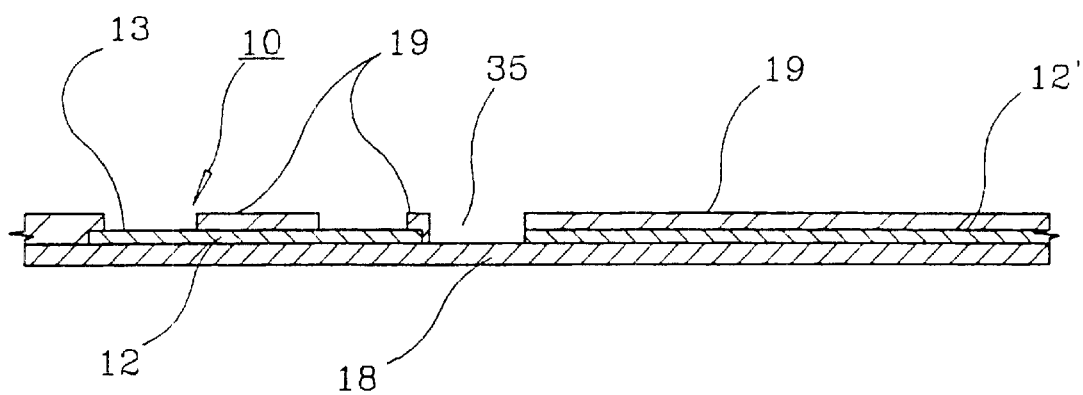
FIG. 7B is a cross-sectional view of the circuit pattern tape taken along the line III—III of FIG. 7A.

FIG. 7A is a plan view of a circuit pattern tape 10 for semiconductor packages according to a first example of the third embodiment of the present invention in which at least one bowing-prevention element 35 is provided. FIG. 7B is a cross-sectional view taken along the line III—III in FIG. 7A. For simplicity of description, the following description is made in conjunction with both FIGS. 7A and 7B.

The circuit pattern tape 10 shown in FIG. 7A has a square shape. As shown in FIG. 7A, a plurality of circuit pattern units 11 are centrally arranged on the circuit pattern tape 10 to form a circular portion 5 of the circuit pattern tape 10 that has the same size and shape as a wafer to which the circuit pattern tape 10 is to be laminated. The circuit pattern tape 10 also has a square peripheral portion 6 on which no circuit pattern units are formed. The peripheral portion 6 is arranged around the circular portion 5. A thin, planar metal layer 12' exists on the peripheral portion 6. A frame portion 7 is arranged at the outer periphery of the peripheral portion 6. A flexible insulating layer 18, such as a polyimide resin layer, is disposed below the thin metal layer 12'.

At least one arcuate bowing-prevention element 35 is formed at the peripheral portion 6 between the circular portion 5 and the frame portion 7 in a region where both the thin metal layer 12' and the solder mask 19 are omitted or eliminated. In the first example illustrated, a plurality of arcuate bowing-prevention elements 35 are provided. The flexible insulating layer 18 is exposed through the bowing-prevention elements 35. However, the present invention is not limited to this particular bowing-prevention structure. For example, the bowing-prevention elements 35 may be formed at regions where the flexible insulating layer 18 and the thin metal layer 12' are omitted, but where a solder mask 19 is included.

The bowing-prevention elements 35 may take the form of an opening into, or entirely through, the circuit pattern tape 10, and it is intended that such configurations be included in the scope of the present invention. The individual and collective shapes of the bowing-prevention elements 35 are relatively unlimited. A region 33 for attaching a recognition mark, such as a bar code, may be defined on a part of the bowing-prevention elements 35. At least one bus bar 29 may also be provided between adjacent bowing-prevention elements 35 for the same purpose as those described above in connection with the first embodiment.

A plurality of bowing-prevention radial grooves 36 are formed at the peripheral portion 6 of the circuit pattern tape 10 in the same manner and for the same purpose as in the first embodiment described above. In this embodiment, the thin, planar metal layer 12' (see FIG. 7B) has a comb-toothed shape connecting the outer periphery of the circular portion 5 to the frame portion 7. As shown in FIG. 7A, the collective shape of the bowing-prevention elements 35 is that of a segmented ring. This shape has an additional advantage in that it renders the peripheral portion 6 thinner than other portions of the circuit pattern tape 10 in the area around the outer periphery of the wafer 2, and hence, makes it easier to cut and remove after the circuit pattern tape 10 has been laminated to the wafer 2.

Thus, the circuit pattern tape 10 of FIG. 7A has the same basic structure as the circuit pattern tape of the first embodiment shown in FIG. 1A, except that it is not provided with either the second dummy pattern 24 or the microscopic bowing-prevention holes 25 at the peripheral portion 6, as provided in the first embodiment.

Figure 8A:
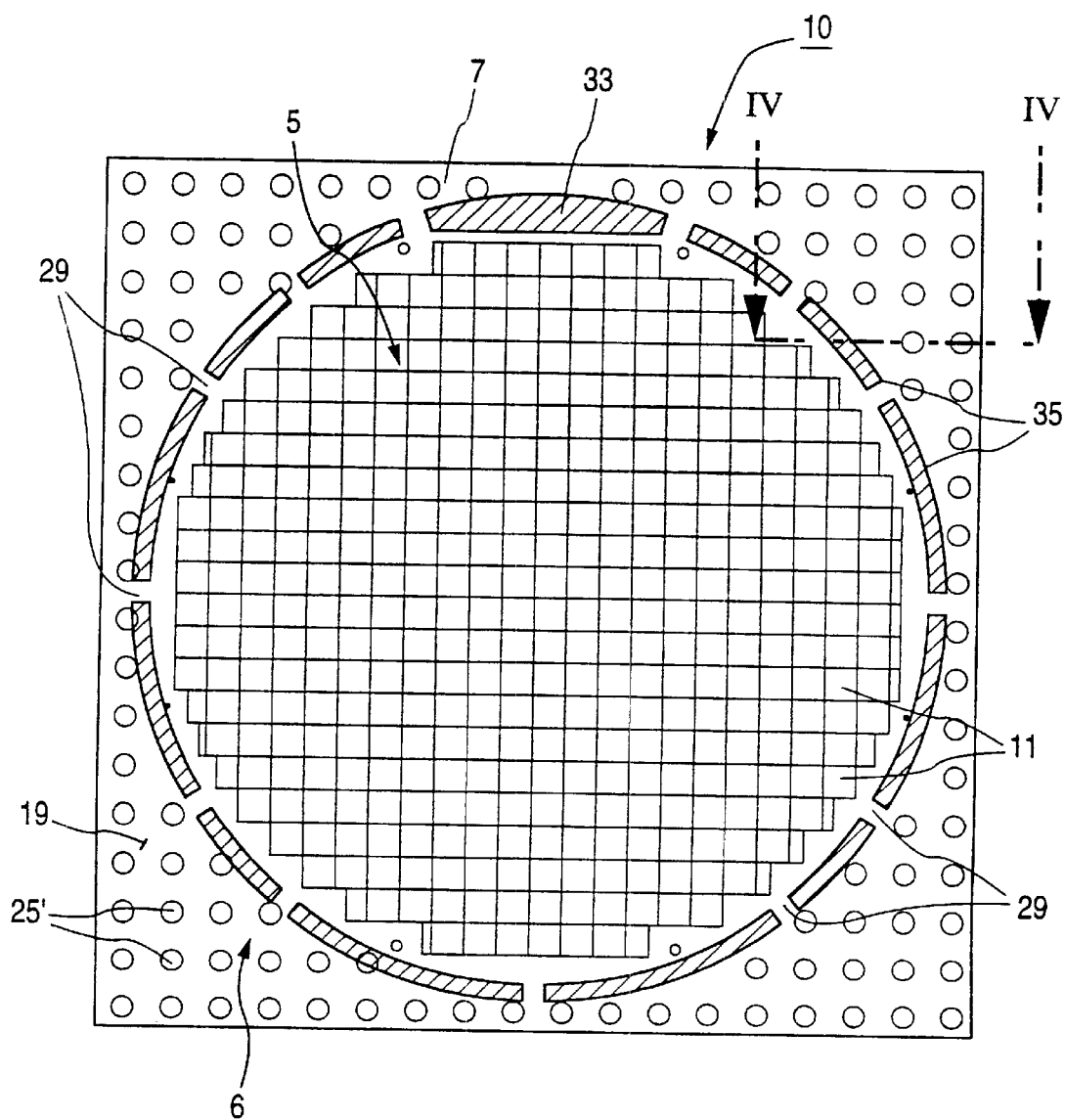
FIG. 8A is a plan view of a circuit pattern tape for semiconductor packages according to a second example of the third preferred embodiment of the present invention in which at least one bowing-prevention element and a bowing-prevention pattern are provided.
Figure 8B:
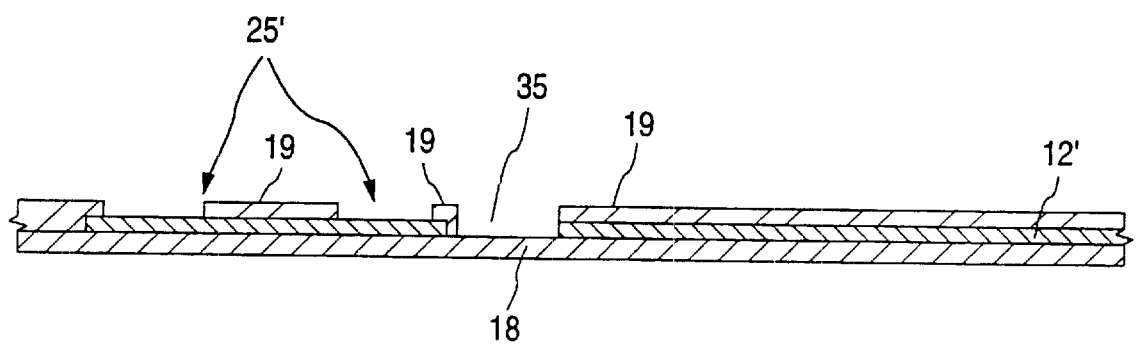
FIG. 8B is a cross-sectional view of the circuit pattern tape taken along the line IV—IV of FIG. 8A.

FIG. 8A is a plan view illustrating a circuit pattern tape 10 for semiconductor packages according to a second example of the third embodiment of the present invention in which at least one bowing-prevention element 35 is provided. FIG. 8B is a cross-sectional view taken along the line IV—IV in FIG. 8A. For simplicity of description, the following description is made in conjunction with both FIGS. 8A and 8B.

The circuit pattern tape 10 of FIGS. 8A and 8B has the same basic structure as the first example of the third embodiment shown in FIGS. 7A and 7B, except that a plurality of large holes 25' are formed in the solder mask 19 in the peripheral portion 6 of the tape in place of the bowing-prevention radial grooves 36 provided in the first example of the third embodiment shown in FIGS. 7A and 7B. Thus, in the description that follows, only the differences in the two configurations is discussed.

As shown in FIG. 8B, the peripheral portion 6 of the circuit pattern tape 10 has a laminated structure comprising a flexible insulating layer 18, a thin, planar metal layer 12' laminated on the flexible insulating layer 18, and a solder mask 19 formed on the thin metal layer 12'. Due to the relatively large differences between the respective thermal coefficients of expansion of the materials of this laminated structure, bowing of the structure can easily occur with changes in its temperature, such as when the structure is returned to room temperature after being subjected to a lamination procedure at a relatively high temperature. This bowing of the circuit pattern tape 10 can make it difficult to laminate the circuit pattern tape onto a wafer 2, much less achieve the required alignment accuracy in subsequent fabrication processes.

To overcome this problem, the second example of the third embodiment of the present invention includes a plurality of large holes, or openings 25', formed in the solder mask 19 in the peripheral portion 6 of the tape. The openings 25' absorb linear expansion and contraction of the circuit pattern tape 10 caused by heating and cooling, thereby preventing or substantially reducing the bowing phenomenon described above.

Although not shown in the figures, a plurality of plated-on bowing-prevention elements may alternatively be formed in place of the large holes 25' by plating gold and/or nickel disks at positions corresponding to those of the large holes 25' shown. In this alternative embodiment, the solder mask 19 is not formed over the plated bowing-prevention elements. These alternative bowing-prevention elements function identically to the large holes 25' shown to absorb expansion and contraction of the circuit pattern tape 10 with change in its temperature and thereby prevent or substantially reduce bowing in the tape.

Figure 9A:
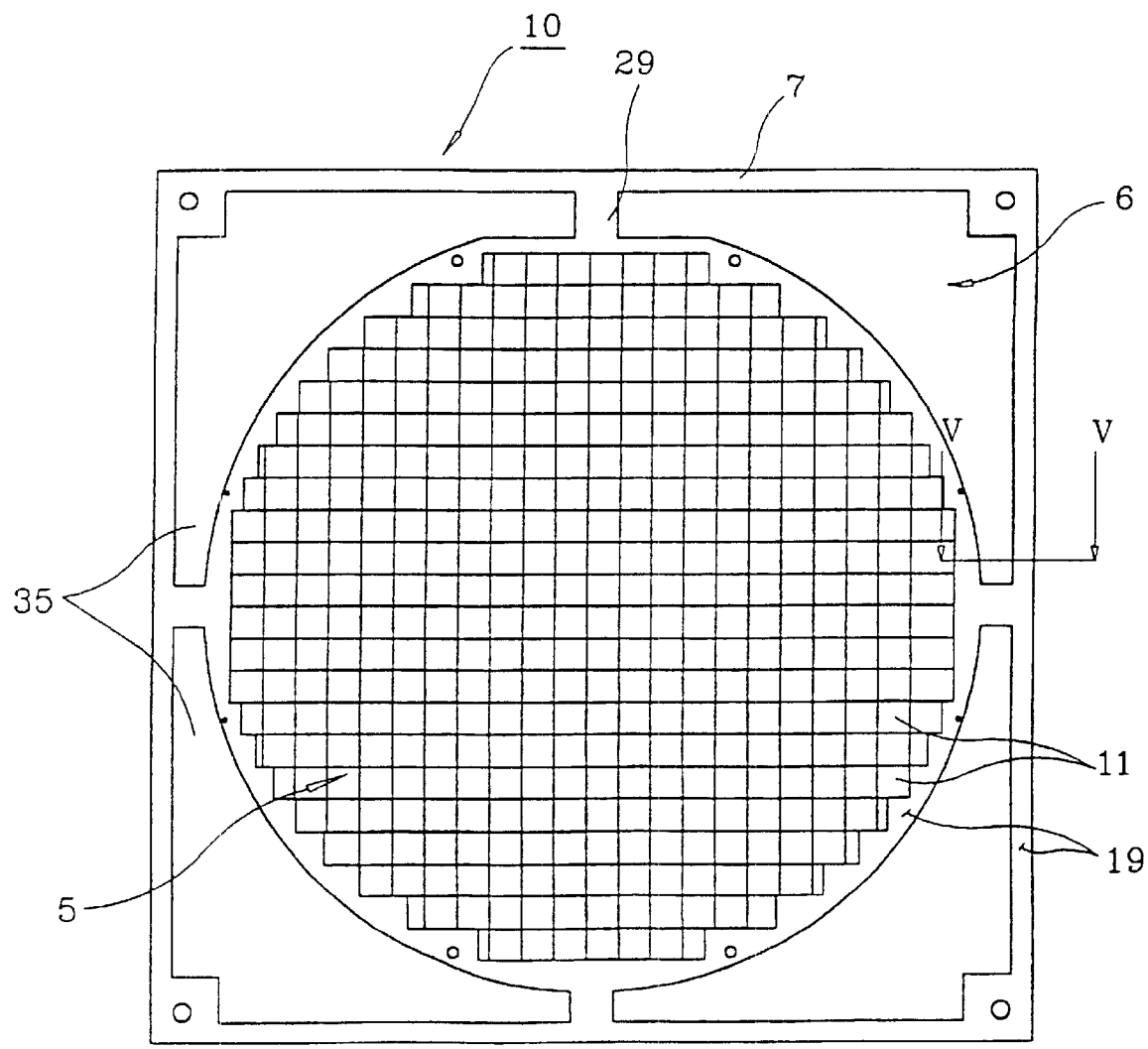
FIG. 9A is a plan view of a circuit pattern tape for semiconductor packages according to a third example of the third embodiment of the present invention in which at least one bowing-prevention element is provided.
Figure 9B:
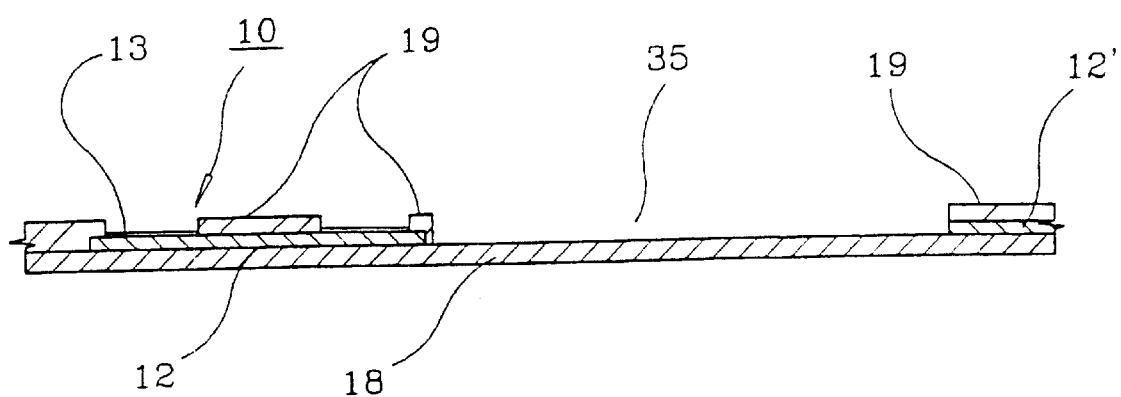
FIG. 9B is a cross-sectional view of the circuit pattern tape taken along the line V—V of FIG. 9A.

FIG. 9A is a plan view illustrating a circuit pattern tape 10 for semiconductor packages according to a third example of the third embodiment of the present invention in which at least one bowing-prevention element 35 is provided. FIG. 9B is a cross-sectional view taken along the line V—V of FIG. 9A. For simplicity of description, the following description is made in conjunction with both FIGS. 9A and 9B.

The circuit pattern tape 10 of FIGS. 9A and 9B has the same basic structure as that shown in FIGS. 7A and 7B, except that it has large bowing-prevention elements 35 shaped such that the thin, planar metal layer 12' is present only at the frame portion 7 and the outer peripheral region of the circular portion 5. As in the two alternative embodiments described above, and for the same purpose, each side of the rectangular frame portion 7 is electrically connected to the circular portion 5 by a bus bar 29 located at an intermediate position thereof.

In the example illustrated, four bowing-prevention elements 35 are arranged around the circular portion 5 at respective ones of the four corner portions of the peripheral portion 6. Each bowing-prevention element 35 consists of a recess formed in the solder mask 19. That is, only the flexible insulating layer 18 is present in the recesses. Alternatively, each bowing-prevention element 35 may consist of a recess formed in the flexible insulating layer 18 such that only the solder mask 19 is present in the areas of the recesses. Where the tape structure includes a thin, glass-epoxy core layer, the bowing-prevention recesses 35 may also consist of a recess formed in the tape such that only the glass-epoxy layer is present in the recesses. Alternatively, the bowing-prevention recesses 35 may be formed such that both the flexible insulating layer 18 and the glass-epoxy layer remain in the recess regions. In yet another alternative embodiment, the bowing-prevention recesses 35 may each consist of an opening formed through the entire thickness of the circuit pattern tape 10. All of the above-described configurations are intended to be included in the scope of the invention.

These alternative bowing-prevention recesses 35 function identically to the large holes 25' or the plated-on disks described above to absorb expansion and contraction of the circuit pattern tape 10 with change in its temperature and thereby prevent or substantially reduce bowing in the tape.

Figure 10A:
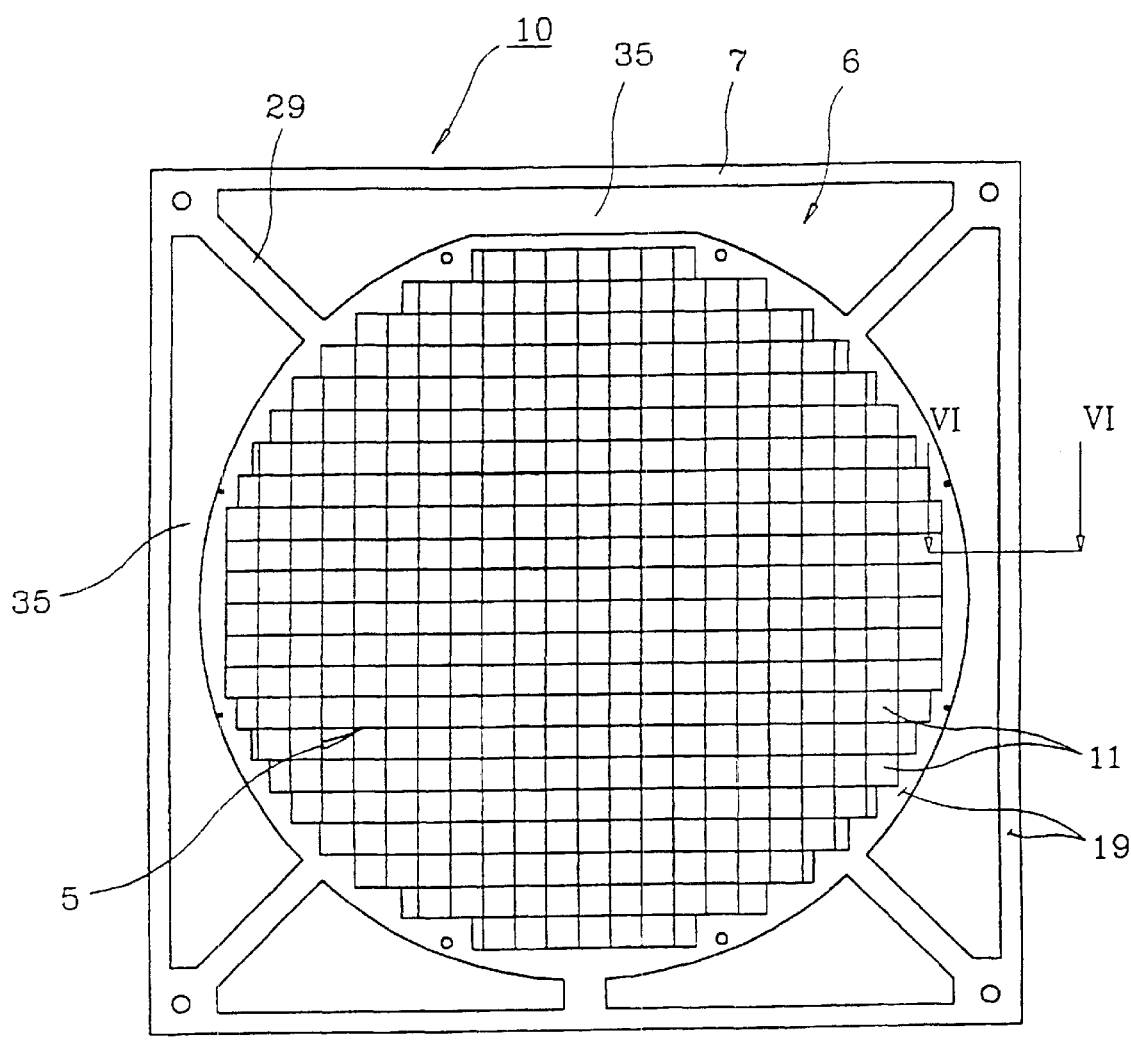
FIG. 10A is a plan view of a circuit pattern tape for semiconductor packages according to a fourth example of the third embodiment of the present invention in which at least one bowing-prevention element is provided.

FIG. 10A is a plan view illustrating a circuit pattern tape 10 for semiconductor packages according to a fourth example of the third embodiment of the present invention in which at least one bowing-prevention element 35 is provided.

Figure 10B:
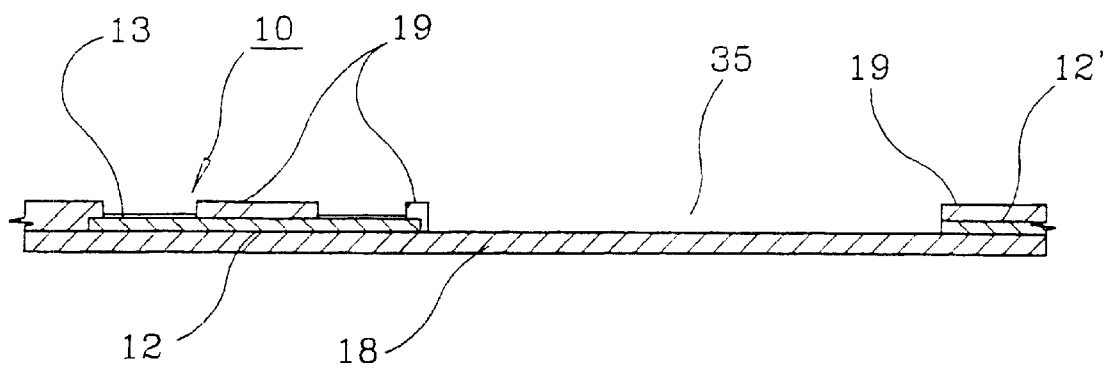
FIG. 10B is a cross-sectional view of the circuit pattern tape taken along the line VI—VI of FIG. 10A.

FIG. 10B is a cross-sectional view taken along the line VI—VI in FIG. 10A. For simplicity of description, the following description is made in conjunction with both FIGS. 10A and 10B.

The circuit pattern tape 10 of FIGS. 10A and 10B has the same basic structure as that shown in FIGS. 9A and 9B, except that each bus bar 29 connects the frame portion 7 to the circular portion 5 at an associated one of the four corners of the frame portion 7, as distinct from the embodiment shown in FIGS. 9A and 9B, in which each bus bar 29 connects the frame portion 7 to the circular portion 5 at an associated one of the four sides of the frame portion 7.

The bus bars 29, which also serve as mechanically supporting "tie bars," are fairly unlimited in terms of their shape, position, and number. Accordingly, it will be understood that the present invention is not limited to the particular configurations of bus bars 29 described and illustrated in the figures.

As will be apparent from the above description, each of the alternative forms of the third preferred embodiment of the circuit pattern tape 10 of the present invention is particularly adapted to prevent or substantially reduce bowing in the circuit pattern tape 10 resulting from a change in its temperature, such as occurs during the high-temperature processes of forming an adhesive layer on the tape, or in laminating the tape to a wafer, which is caused by the use in the tape of materials having different coefficients of thermal expansion.

In summary, FIGS. 7A to 10B all illustrate alternative embodiments of circuit pattern tapes 10, each of which has at least one bowing-prevention element 35, in accordance with the third preferred embodiment of the present invention, respectively.

Figure 11A:
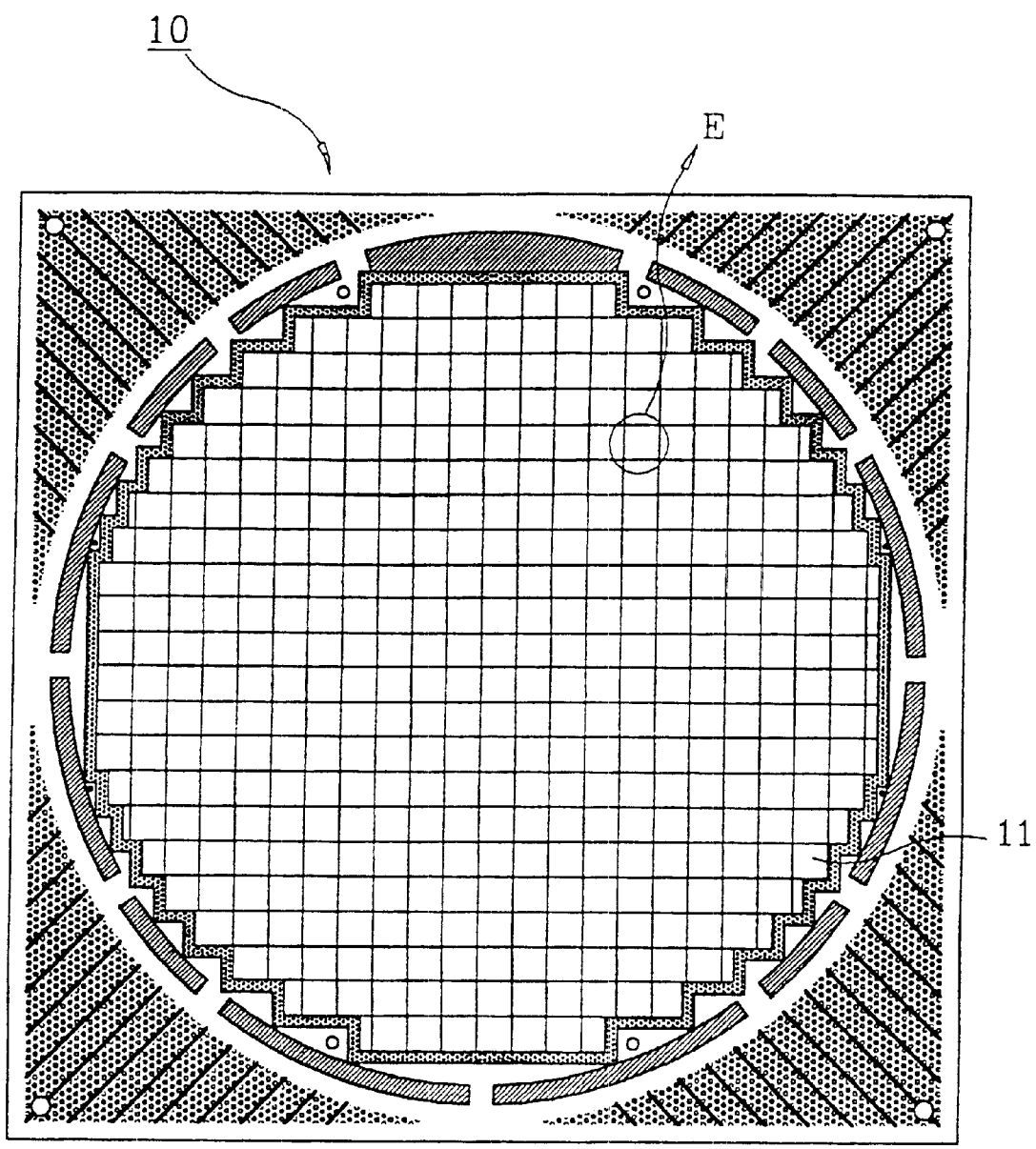
FIG. 11A is a plan view of a circuit pattern tape for semiconductor packages according to a first example of a fourth preferred embodiment of the present invention in which ground bond fingers are provided.
Figure 11B:
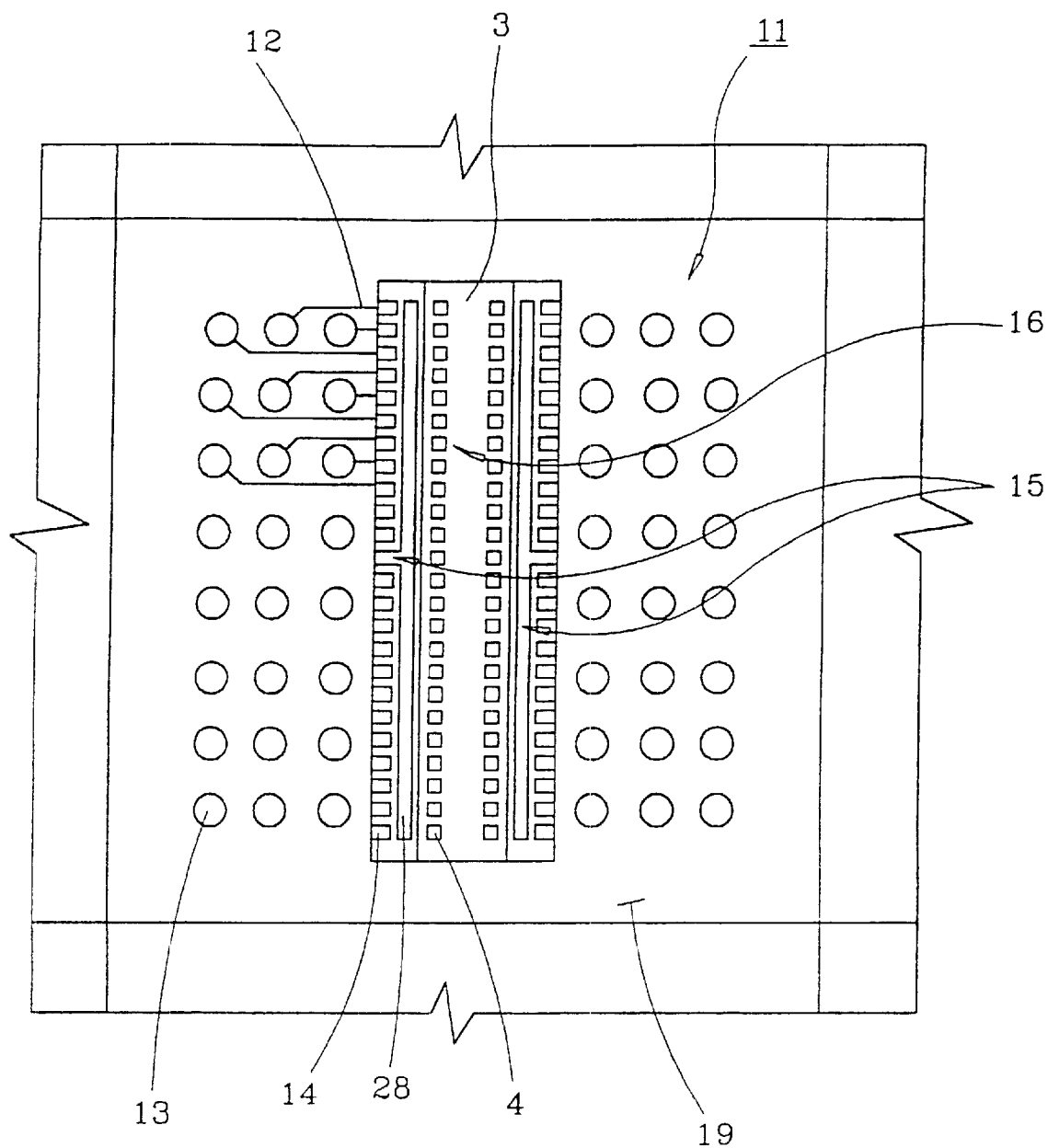
FIG. 11B is a magnified view of the circled portion E in FIG. 11A.
Figure 12:
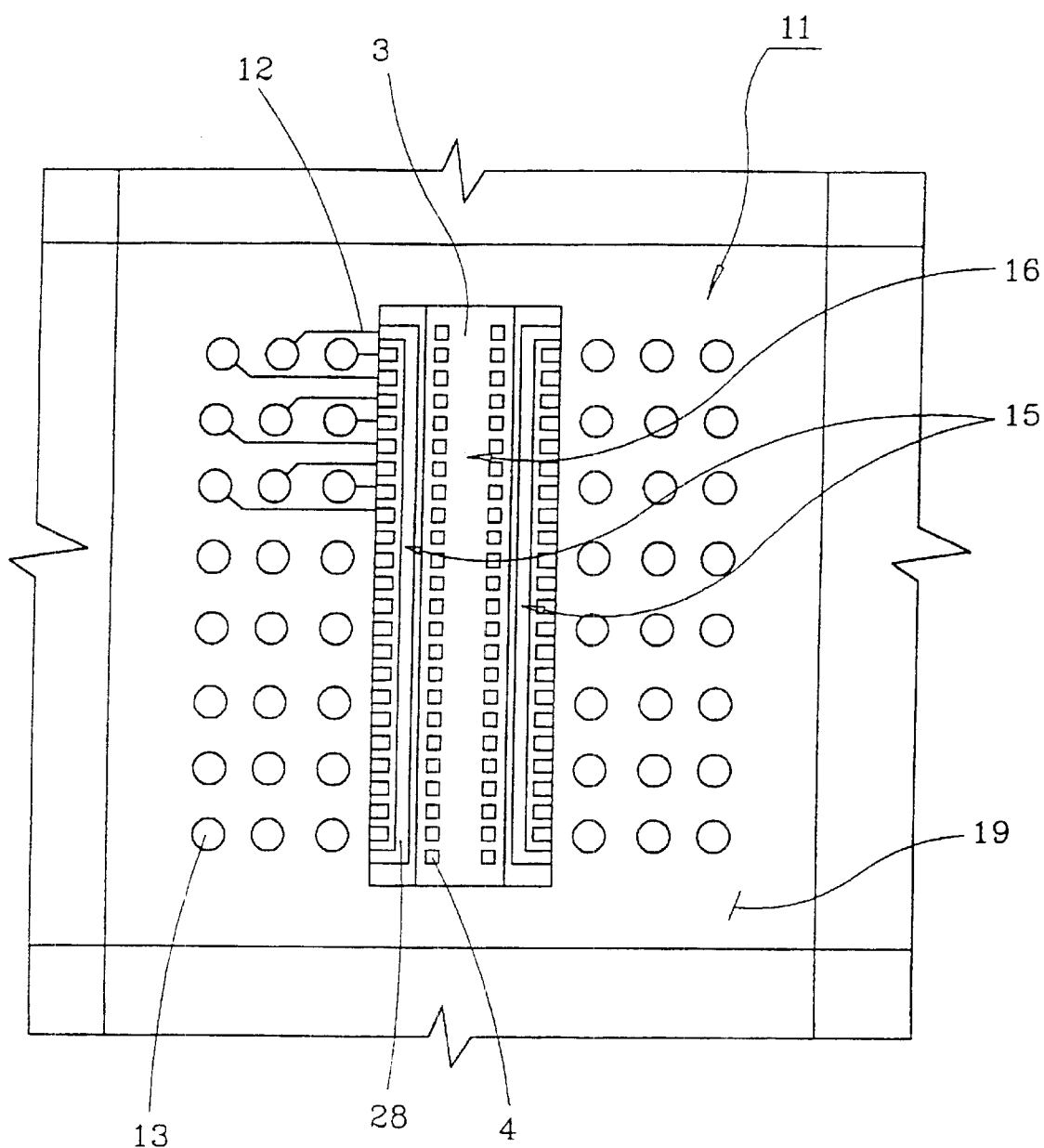
FIG. 12 is a magnified view of the circled portion E in FIG. 11A illustrating a circuit pattern tape for semiconductor packages according to a second example of the fourth embodiment of the present invention in which ground bond fingers are provided.

FIG. 11A is a plan view illustrating a circuit pattern tape 10 for chip size semiconductor packages according to a first example of a fourth embodiment of the present invention, in which ground bond fingers 28 are provided. FIG. 11B is a magnified view of the circled portion E in FIG. 11A. FIG. 12 is a magnified view of the circled portion E in FIG. 11A illustrating a second example of the fourth embodiment of the present invention in which ground bond fingers 28 are provided. Each of the circuit pattern tapes 10 shown in FIGS. 11A through 12 is particularly adapted to avoid a reduced spatial redundancy, and hence, reduced freedom of design, in the pattern units caused by the need to interconnect a large number of the conductive traces for grounding purposes.

When the circuit pattern tape 10 shown in FIG. 11A is laminated onto a wafer, die pads 4 on each semiconductor chip unit 3 in the wafer are upwardly exposed through an associated one of the perforated openings 16 in the opening formation regions of each circuit pattern unit 11, as shown in FIG. 11B. Each solder ball land 13 in each circuit pattern unit 11 is electrically connected to an associated one of the bond fingers 14 located in an associated one of bond finger formation regions 15 by means of a conductive trace 12. The bond fingers 14 on each circuit pattern unit 11 and the die pads 4 on an associated semiconductor chip unit 3 are subsequently electrically connected to one another by means of fine, conductive bonding wires (not shown).

In the embodiment illustrated in FIG. 11B, two ground bond fingers 28 are provided for each circuit pattern unit 11. Each ground bond finger 28 is arranged within the bond finger formation regions 15 on an opposite side of and adjacent to the opening 16. The ground bond fingers 28 are spaced from each other in a direction orthogonal to the direction along which the bond fingers 14 are arrayed. Each ground bond finger 28 has a T-shaped structure, including a first, elongated portion extending in the direction along which the bond fingers 14 are arrayed such that it faces the respective ends of the bond fingers 14, and ia second, short portion in the middle of the bond finger formation regions 15 that extends in the same direction as that in which the bond fingers 14 extend. Each ground bond finger 28 is electrically connected to at least one conductive trace 12.

It should be understood that this aspect of the present invention is not limited to that particular structure illustrated in FIG. 11B. For example, the circuit pattern tape 10 shown in FIG. 12 has the same basic structure as that in FIG. 11B, except that each ground bond finger 28 has a U-shaped structure and is electrically connected at its opposite ends to a respective one of two conductive traces 12. Indeed, two or more conductive traces 12 may be electrically connected to each ground bond finger 28, and such configurations are intended to fall within the scope of this invention.

Figure 13:
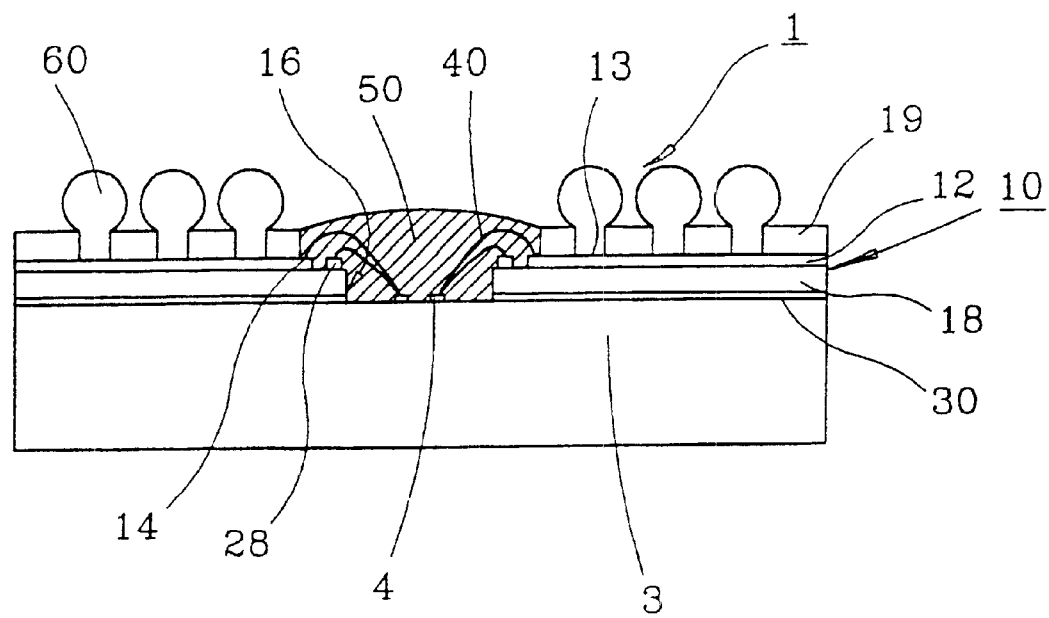
FIG. 13 is a cross-sectional view of a chip size semiconductor package fabricated using the circuit pattern tape having ground bond fingers according to the fourth embodiment of the present invention.

FIG. 13 is a cross-sectional view illustrating a chip size semiconductor package 1 fabricated using a circuit pattern tape 10 having ground bond fingers 28 in accordance with the fourth embodiment of the present invention. Referring to FIG. 13, the circuit pattern tape 10 according to the present invention is laminated onto a semiconductor chip 3 by means of the adhesive layer 30 interposed between the circuit pattern tape 10 and the semiconductor chip 3. The die pads 4 of the semiconductor chip 3, which are arranged within the opening 16 of the circuit pattern tape 10, are electrically connected to respective ones of the bond fingers 14 arranged in the bond finger formation regions 15 (see FIGS. 11B and 12). Selected ones of the die pads 4 are also electrically connected to one or both of the ground bond fingers 28.

In the structure illustrated in FIG. 13, the circuit pattern tape 10 has a laminated structure comprising a flexible insulating layer 18, a conductive circuit pattern, including bond fingers 14, solder ball lands 13, and conductive traces 12, and a solder mask 19 covering the circuit pattern, except for openings therein to expose the bond finger formation regions and the solder ball lands 13, which layers are laminated on top of each other in the above order.

Solder balls 60, which function as external input/output terminals of the package, are attached to each solder ball land 13. A resin envelope 50 is molded in the region that includes the opening 16 and the bond finger formation regions. The resin envelope 50 serves to protect the die pads 4, the exposed, "active" surface of the chip 3, the bond fingers 14, the ground bond fingers 28, and the delicate bonding wires 40, which are all sealed therein, from harmful external elements, e.g., moisture.

It should be understood that the circuit pattern tape 10 of the present invention is not limited to the configuration illustrated. For example, the circuit pattern tape 10 may comprise only two layers, e.g., a solder mask 19 and a circuit pattern, or four layers, e.g., a solder mask 19, a circuit pattern, a flexible insulating layer, and a core layer, or three layers, e.g., a solder mask 19, a circuit pattern, and a core layer.

The circuit pattern tape 10 according to the fourth embodiment of the present invention makes it possible easily to obtain spatial redundancy on the circuit pattern units, thereby greatly reducing limitations in the freedom of design of the circuit patterns, as compared to the prior art configuration in which a plurality of the conductive traces must be electrically connected together within the circuit pattern formation region so that they can be used for grounding purposes. In a chip size semiconductor package 1 fabricated using the novel circuit pattern tape 10 of this invention, it is readily possible to bond all of the ground die pads of the semiconductor chip 3 to the ground bond fingers 28 in common. This configuration easily accommodates an increased number of die pads 4 on the chip 3 resulting from the recent trend toward more compact, high performance chips. Because it provides a more efficient grounding architecture for the chip, this configuration also results in an improved electrical performance of the chip.

Figure 14:
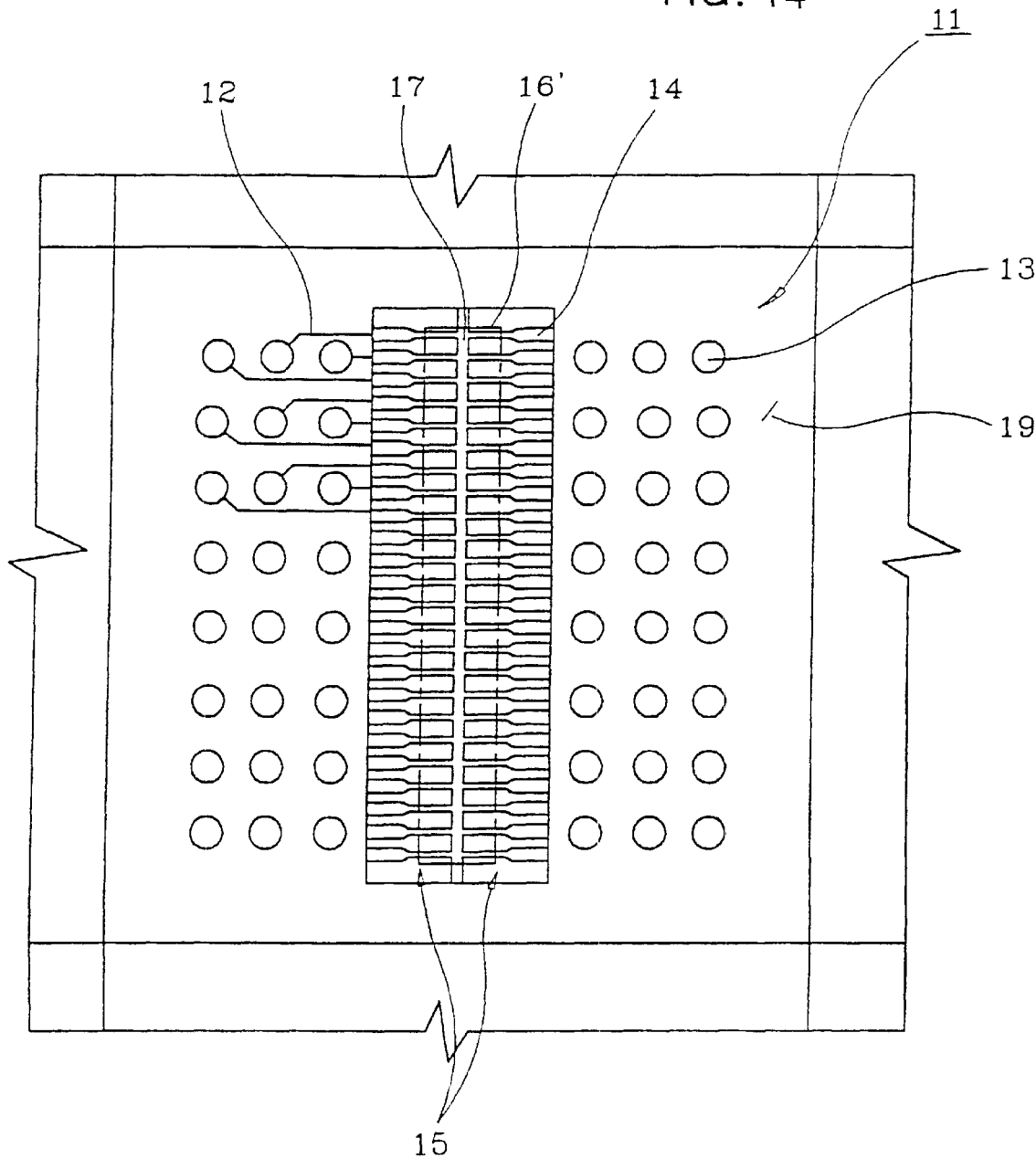
FIG. 14 is a plan view of a circuit pattern tape for semiconductor packages according to a fifth preferred embodiment of the present invention in which bond fingers are formed at each opening formation region, along with a bus line electrically connected thereto, FIG. 14 being a magnified view of the circled portion E in FIG. 11A.

FIG. 14 is a plan view illustrating a circuit pattern tape 10 for semiconductor packages according to a fifth embodiment of the present invention in which bond fingers 14 are formed at each opening formation region 16', along with a bus line 17 electrically connected thereto. FIG. 14 is a magnified view corresponding to the circled portion E in FIG. 11A. This embodiment is particularly adapted to permit the easy and complete removal of plating bus lines, even when there is a slight misalignment involved in the singulation process.

As explained above, the bus line 17 is a conductive line needed in an electrolytic or electroless plating process to plate a nickel (Ni)/gold (Au) plating on the solder ball lands 13 to permit the easy attachment of solder balls thereto, and/or on the wire bond fingers 14 to permit easy bonding of the bonding wires thereto, respectively. The bus lines 17, which are provided in each one of the circuit pattern units 11, serve to electrically connect all circuit patterns together temporarily, while this plating process is effected. However, the bus lines 17 must be completely removed from the finished semiconductor packages, because if they are incompletely removed, some of the conductive traces 12 may remain electrically connected to each other, thereby resulting in inoperative or malfunctioning semiconductor packages.

In the embodiment of circuit pattern unit 11 shown in FIG. 14, the bus line 17 is disposed centrally in the opening formation region 16' and extends in a longitudinal direction therein corresponding to the direction of arrangement of the bond fingers 14. The bond fingers 14 are electrically connected to the bus line 17 by a plurality of conductive traces, each extending between an associated one of the bond fingers 14 and the bus line 17, respectively. Each conductive trace has a reduced width, as compared to the width of each bond finger 14.

The circuit pattern tape 10 is perforated at its opening formation regions 16' to create the openings 16 prior to its lamination onto a wafer 2. Simultaneously, the portions of the tape containing the bus lines 17 are also punched out, thereby completely removing the bus lines from the tape.

The circuit pattern tape 10 according to the fifth embodiment of the present invention is therefore particularly well adapted to permit the easy and complete removal of the bus lines 17 from the tape, because a relatively large tolerance is available in the width of the cut involved in the punching process used to create the openings 16, and hence, to remove the bus lines 17. Accordingly, an improvement in the yield of semiconductor packages is achieved.

Figure 15A:
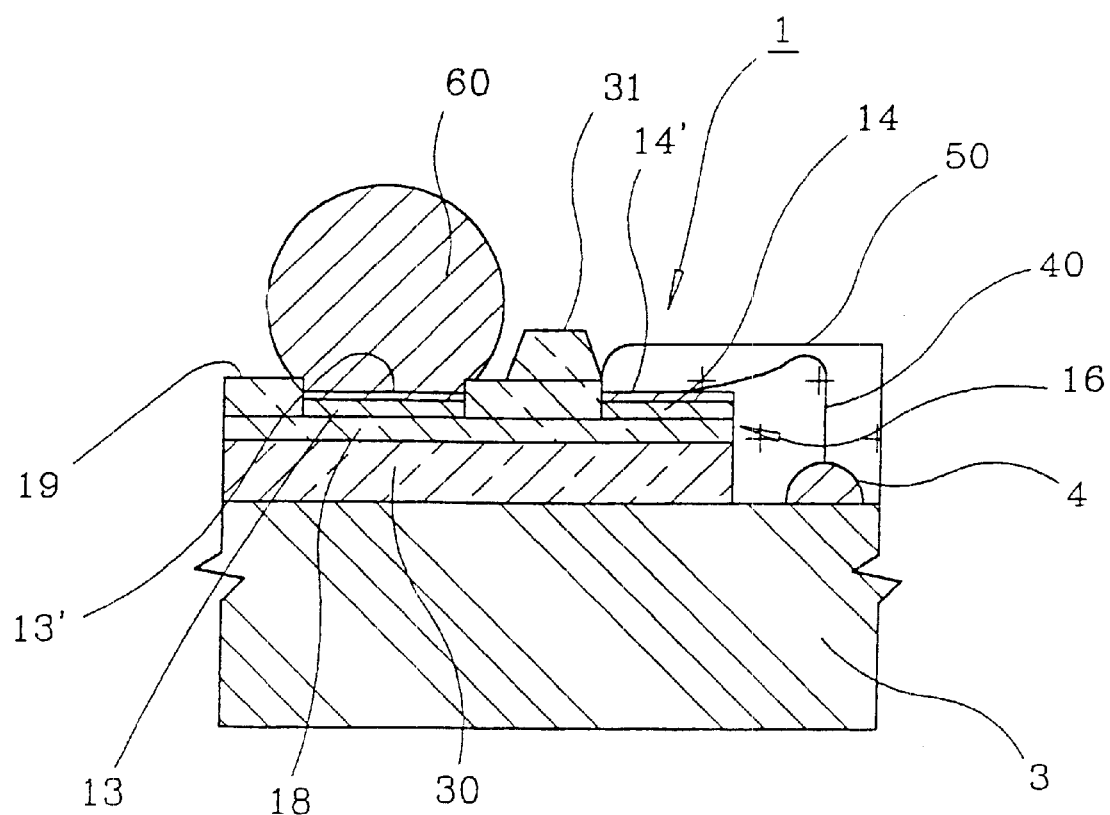
FIG. 15A is a partial cross-sectional view of a chip size semiconductor package fabricated using a circuit pattern tape for semiconductor packages in accordance with a first example of a sixth preferred embodiment of the present invention showing a dam adapted to prevent an overflow of liquid encapsulating material.

FIG. 15A is a partial cross-sectional view illustrating a chip size semiconductor package 1 fabricated using a circuit pattern tape 10 in accordance with a first example of a sixth embodiment of the present invention in which a dam 31 is formed on the tape to prevent an overflow from it of a liquid encapsulating material.

Figure 15B:
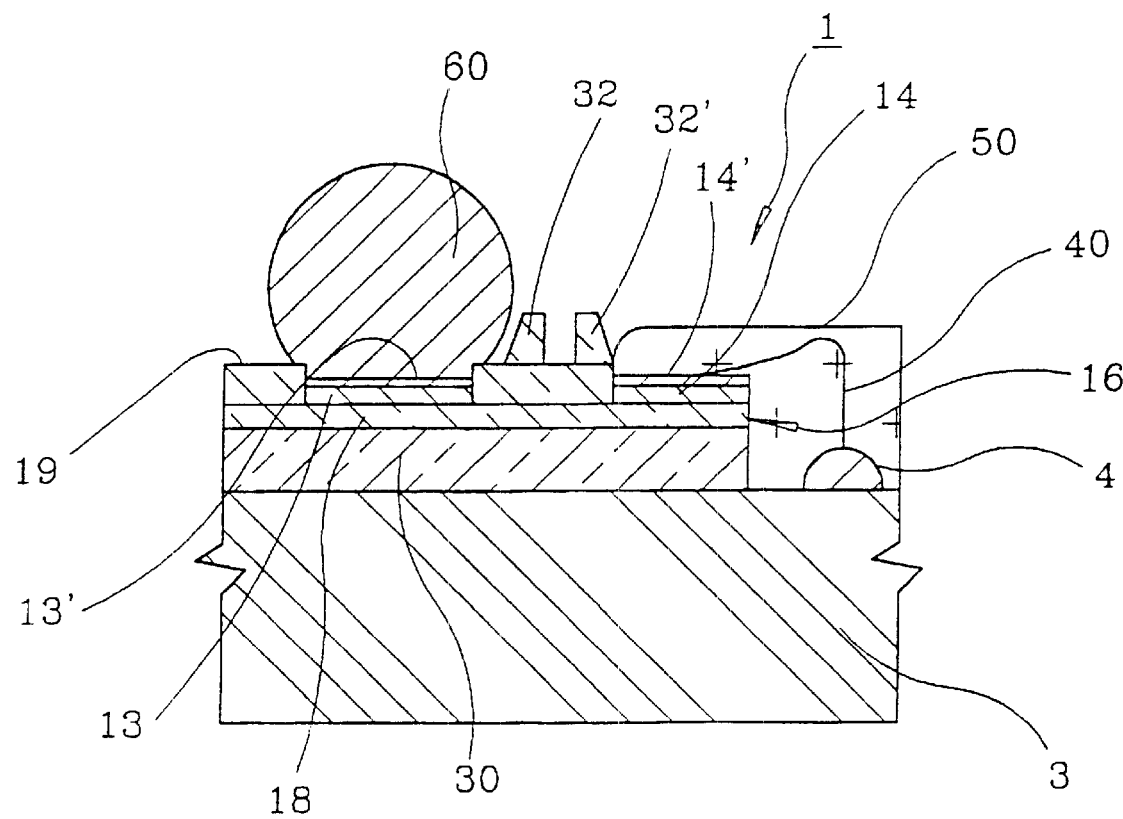
FIG. 15B is a partial cross-sectional view of a chip size semiconductor package fabricated using a circuit pattern tape for semiconductor packages in accordance with a second example of the sixth preferred embodiment of the present invention.
Figure 16A:
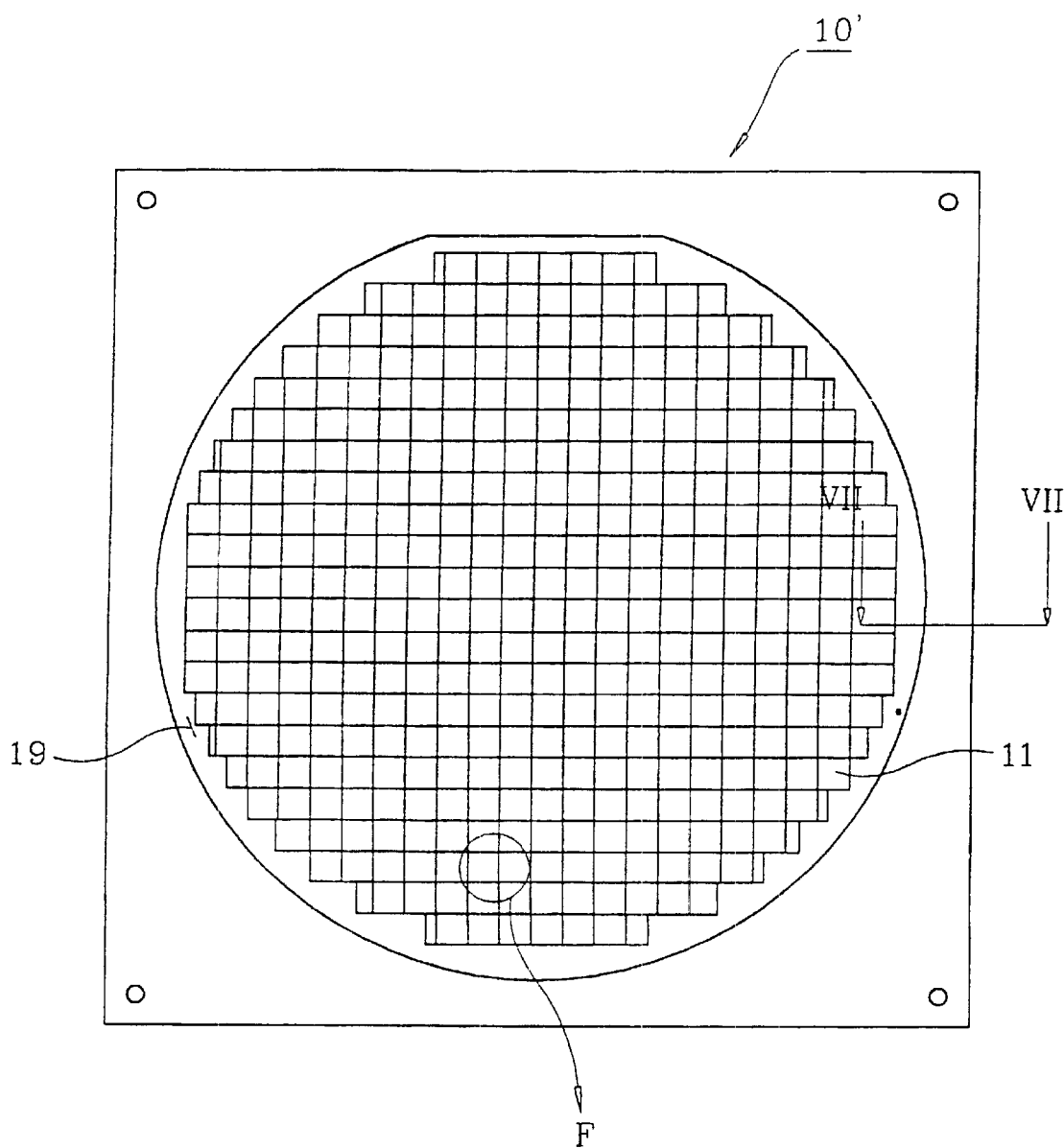
FIG. 16A is a plan view illustrating a conventional circuit pattern tape for semiconductor packages.
Figure 16B:
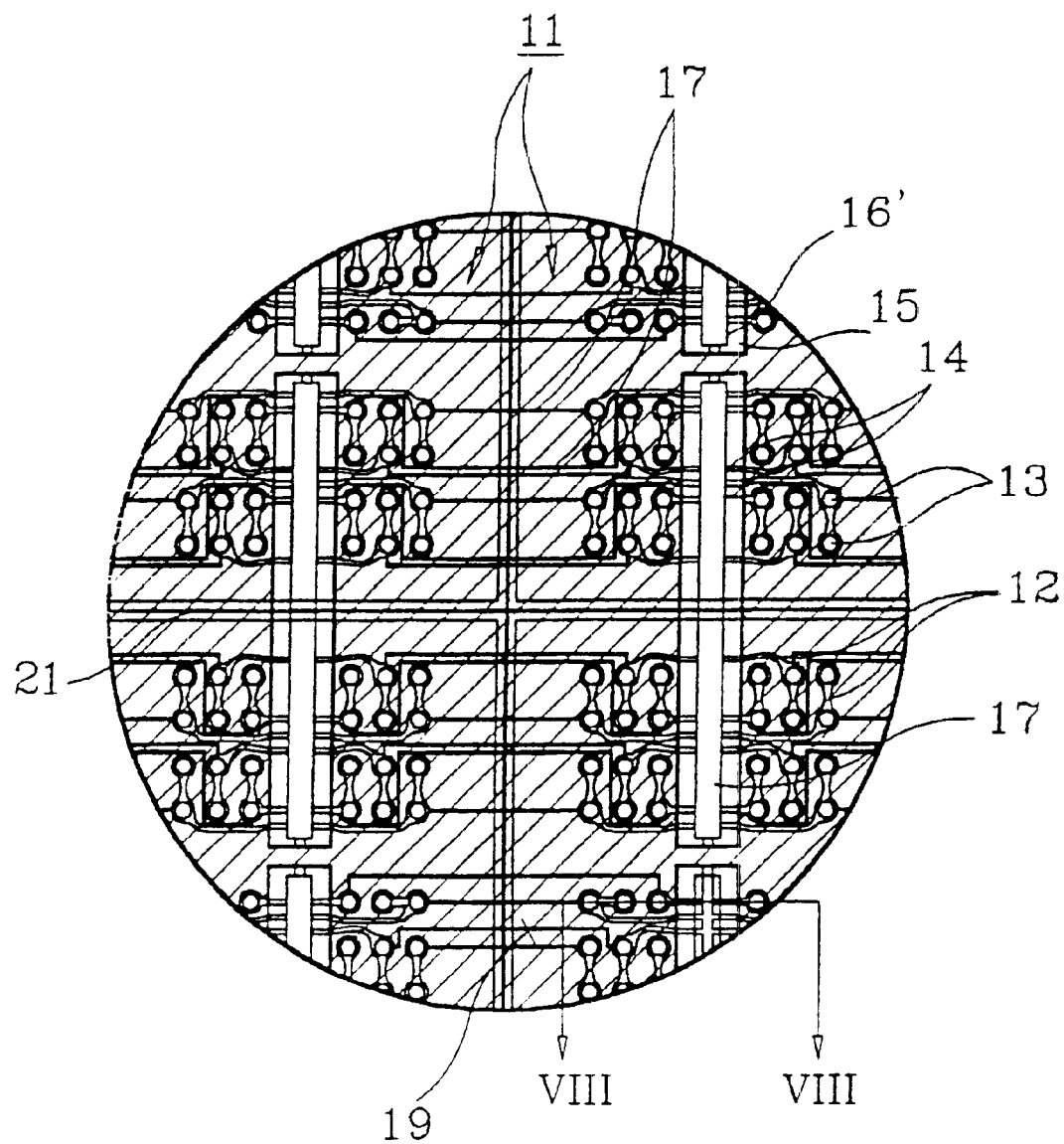
FIG. 16B is a magnified view of the circled portion F of the circuit pattern tape in FIG. 16A.
Figure 16C:
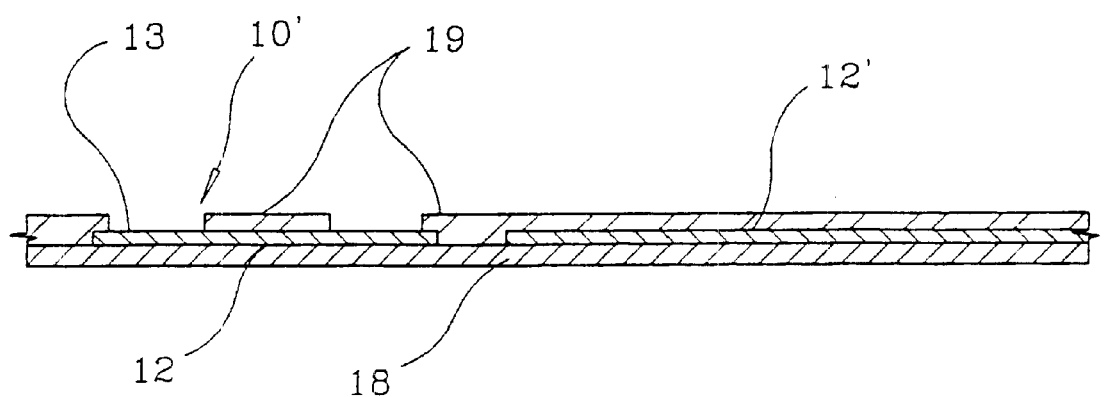
FIG. 16C is a cross-sectional view of the circuit pattern tape of FIG. 16A, as taken along the line VII—VII therein.
Figure 16D:
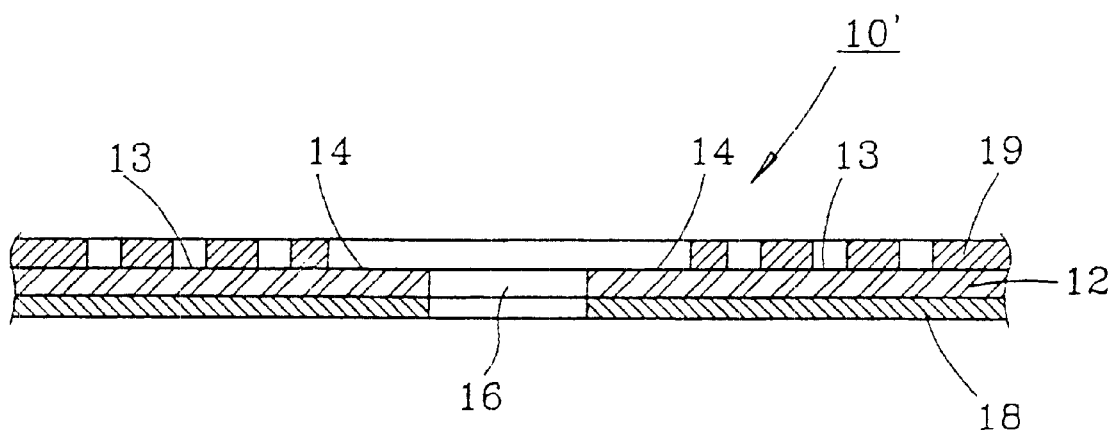
FIG. 16D is a cross-sectional view of the circuit pattern tape of FIG. 16B, as taken along the line VIII—VIII therein.

FIG. 15B is a partial cross-sectional view illustrating a chip size semiconductor package 1 fabricated using a circuit pattern tape in accordance with a second example of the sixth embodiment of the present invention, in which first and second dams 32 and 32' adapted to prevent an overflow of liquid encapsulating material are formed on the tape. For brevity of description, both of the above examples will be described simultaneously. The sixth embodiment of the present invention is particularly adapted to prevent the overflow of liquid encapsulating material during the formation of protective resin envelopes on the wafer-tape assembly.

The chip size semiconductor package 1 of FIGS. 15A or 15B has the same basic structure as that shown in FIG. 13, except that it includes the dam 31, or two dams 32 and 32', while the ground bond fingers 28 (see FIG. 13) have been omitted for clarity. Accordingly, only the differences between the configurations will be described.

In FIGS. 15A and 15B, the reference numeral 13' denotes a plated metal layer made of, for example, gold and/or nickel, and adapted to enable the easy fusion of solder balls 60 to the solder ball lands 13, while the reference numeral 14' denotes a similar plating adapted to enable easy bonding of the bonding wires 40 to the bond fingers 14. In either of the two embodiments shown in FIGS. 15A or 15B, the circuit pattern tape 10 has a laminated structure comprising a flexible insulating layer 18, such as a polyimide layer, a conductive circuit pattern (including conductive traces, solder ball lands 13, bond fingers, etc.), and a solder mask 19, which are layered on top of each other in that order.

However, it should be understood that this aspect of the invention is not limited to the particular structure described and illustrated in FIGS. 15A or 15B. Indeed, this aspect of the invention is applicable to any of the various structures of circuit pattern tapes 10 in accordance with the present invention described above. Accordingly, it is intended that all such alternative embodiments be included in the scope of this invention.

According to the sixth embodiment of the present invention, the chip size semiconductor package 1 of FIG. 15A or 15B has the dam 31, or a pair of dams 32 and 32', formed along the outer edges of the bond finger formation regions 15 (see FIG. 1B), and adapted to prevent the overflow of liquid envelope material from those regions. Specifically, the dam 31 or the dams 32 and 32' are formed on the solder mask 19 on a portion of it that defines the outer edges of the bond finger formation regions 15. The formation of the dam 31 or the dams 32 and 32' may be achieved by laminating a solder mask layer made of a material identical to or different from that of the solder mask 19 on the above-described portion of the solder mask 19, or by forming the solder mask 19 to include an upper surface that is initially level with the intended upper surface the dam 31 or the dams 32 and 32', and then etching away the solder mask 19 around the regions of the dam 31 or dams 32 and 32' to the desired depth.

The only difference between the two circuit pattern tapes 10 shown respectively in FIGS. 15A and 15B is in the number of dams formed thereon. Only one dam 31 is formed in the structure of FIG. 15A, whereas, two parallel dams 32 and 32' are formed in the structure of FIG. 15B.

In the circuit pattern tape 10 of the sixth embodiment of the present invention illustrated in FIG. 15A or 15B, the dam 31, or the dams 32 and 32', absolutely prevent the liquid encapsulating material from overflowing when it is dispensed into the opening 16 and the bond finger formation regions 15. Accordingly, the liquid envelope material is prevented from running off onto the solder ball lands 13. In the structure shown in 15B, the two parallel dams 32 and 32' confine the encapsulant to the desired region even more effectively.

Although certain particular embodiments of the present invention have been described and illustrated herein for purposes of its illustration, those skilled in the art will appreciate that various modifications, additions and substitutions can be made to the embodiments disclosed without departing from the scope and spirit of the invention. Therefore, the embodiments illustrated and described herein should be understood as being exemplary in nature only, and not by way of limitation on the scope of this invention, which is defined by the claims appended hereafter.

What is claimed is:

1. A circuit pattern tape for wafer-scale production of chip size semiconductor packages, comprising:
   a plurality of individual, interconnected circuit pattern units arranged in a two-dimensional array and separated from each other in said tape by singulation lines, each said circuit pattern unit comprising:
   a centrally located opening formation region;
   bond finger formation regions arranged in opposing relationship on opposite sides of said opening formation region;
   said opening formation region and said bond finger formation regions each being arranged such that they do not intersect any of said singulation lines;
   a plurality of conductive metal bond fingers arranged in each of said bond finger formation regions;

a plurality of conductive metal solder ball lands arranged outside of said bond finger formation regions;

a plurality of conductive metal traces electrically connecting each of said bond fingers to an associated one of said solder ball lands; and, an insulating solder mask formed over said circuit pattern unit and having openings therein respectively exposing said opening formation region, said bond finger formation regions, and said solder ball lands therethrough.

2. The circuit pattern tape of claim 1, wherein each said circuit pattern unit further comprises a first dummy pattern made of the same conductive metal as said solder ball lands, said conductive traces, and said bond fingers, and arranged within said circuit pattern unit such that said conductive metal is uniformly distributed therein.

3. The circuit pattern tape of claim 2, wherein said first dummy pattern comprises a plurality of disk-shaped elements, a plurality of linear-shaped elements, or a plurality of both disk-shaped and linear-shaped elements.

4. The circuit pattern tape of claim 1, further comprising a flexible insulating layer below said plurality of circuit pattern units.

5. The circuit pattern tape of claim 4, wherein said flexible insulating layer comprises a layer of polyimide.

6. The circuit pattern tape of claim 4, further comprising a core layer below said flexible insulating layer.

7. The circuit pattern tape of claim 6, wherein said core layer comprises a thin metal layer or a thin glass-epoxy layer.

8. The circuit pattern tape of claim 1, further comprising a thin, glass-epoxy core layer below said plurality of circuit pattern units.

9. The circuit pattern tape of claim 1, further comprising a plurality of singulation line locating grooves formed in said tape along said singulation lines.

10. The circuit pattern tape of claim 9, wherein each of said singulation line identification grooves has a cross shape and is located at a position where at least two adjacent ones of said circuit pattern units adjoin each other.

11. The circuit pattern tape of claim 1, wherein each said circuit pattern unit further comprises a conductive plating bus line formed in said opening formation region and between said bond finger formation regions, said bus line being electrically connected to each of said plurality of bond fingers in said circuit pattern unit and to bus lines in each of the other ones of said circuit pattern units in said tape.

12. The circuit pattern tape of claim 11, wherein said bus line is connected to said bond fingers by a conductive trace, and wherein each of said bond fingers has a width greater than that of said conductive traces electrically connecting said bus line to said bond fingers and said conductive traces electrically connecting said bond fingers to said associated ones of said solder ball lands.

13. The circuit pattern tape of claim 1, wherein each said circuit pattern unit further comprises a ground finger formed in each of said opposing bond finger formation regions.

14. The circuit pattern tape of claim 13, wherein said bond fingers are arranged in rows in each said bond finger formation region, and wherein each said ground finger extends in a direction parallel to said rows such that said ground finger faces respective ends of said bond fingers.

15. The circuit pattern tape of claim 1, wherein each said circuit pattern unit further comprises:

a first dam formed on said solder mask and surrounding outer edges of said bond finger formation regions and adapted to prevent an overflow of a liquid encapsulating material dispensed into said bond finger formation regions.

16. The circuit pattern tape of claim 15, wherein each of said circuit pattern units further comprises:

a second dam formed on said solder mask around said first dam and adapted to prevent an overflow of a liquid encapsulating material dispensed into said bond finger formation regions.

17. The circuit pattern tape of claim 15, wherein said dam comprises an insulating layer formed on said solder mask.

18. The circuit pattern tape of claim 15, wherein said dam comprises a portion of said solder mask having a thickness greater than that of a remaining portion of said solder mask.

19. The circuit pattern tape of claim 4, wherein said circuit pattern tape further comprises:

a circular central portion having the same size and shape as a semiconductor wafer, said circuit pattern units being arrayed entirely within said circular central portion;

a square or rectangular frame portion comprising a thin, conductive metal layer surrounding said circular portion;

a peripheral portion comprising a thin, conductive metal layer interposed between said circular portion and said frame portion, said thin, conductive metal layer in said peripheral portion being electrically connected to said thin, conductive metal layer in said frame portion by at least one bus bar; and, at least one bowing-prevention element formed in said peripheral portion such that neither said solder mask nor said thin, conductive metal layer is present in said bowing-prevention element.

20. The circuit pattern tape of claim 19, further comprising a second dummy pattern made of a conductive metal and arranged around the periphery of said circular portion such that said conductive metal is uniformly distributed in a radial direction relative to said central portion.

21. The circuit pattern tape of claim 20, wherein said second dummy pattern comprises a plurality of uniformly arranged disks.

22. The circuit pattern tape of claim 19, further comprising a plurality of through-holes formed through at least said solder mask and adapted to reduce bowing of said tape with a change in its temperature.

23. The circuit pattern tape of claim 19, further comprising a plurality of radial grooves formed in at least said solder mask and adapted to reduce bowing of said tape with a change in its temperature.

24. The circuit pattern tape of claim 19, further comprising an identification mark attachment region formed in said peripheral portion such that neither said solder mask nor said thin, conductive metal layer is present in said identification mark attachment region.

25. A chip size semiconductor package comprising:

a semiconductor chip having edges and a plurality of die bonding pads on an active surface thereof;

a circuit pattern tape laminated to said active surface of said chip, said circuit pattern tape having edges coincident with said edges of said chip, a central opening formed therein, a plurality of conductive metal bond fingers arranged around said opening, a plurality of conductive metal solder ball lands arranged around said bond fingers, a plurality of conductive metal traces electrically connecting respective ones of said bond fingers and said solder ball lands to each other, and an insulative solder mask formed over said circuit pattern tape and having a plurality of openings in it through which said central opening, said bond fingers, and said solder ball lands are respectively exposed;

a plurality of solder balls, each attached to a respective one of said solder ball lands through a respective one of said openings in said solder mask and functioning as an input/output terminal of said package;

a plurality of conductive bonding wires electrically connecting respective ones of said bond fingers on said tape and said die pads on said chip to each other through said central opening in said tape; and, a resin envelope encapsulating said central opening, said die pads, said bonding pads, and said bonding wires to protect them from harmful environmental elements, said envelope being formed thereon such that said envelope does not intersect any of said coincident edges of said tape and said chip.

26. The semiconductor package of claim 25, wherein said circuit pattern tape further comprises a dummy pattern made of the same conductive metal as said bond fingers, said solder ball lands, and said conductive traces, and arranged on said circuit pattern tape such that said conductive metal is uniformly distributed thereon.

27. The circuit pattern tape of claim 26, wherein said dummy pattern comprises a plurality of disk-shaped elements, a plurality of linear-shaped elements, or a plurality of both disk-shaped and linear-shaped elements.

28. A chip size semiconductor package comprising:

a rectangular semiconductor chip having four exposed peripheral edges and a plurality of bonding pads on an active surface thereof;

a rectangular circuit pattern tape laminated to said active surface of said chip, said circuit pattern tape having four outer edges each coincident with a corresponding peripheral edge of said semiconductor chip, and a rectangular central opening formed therein, wherein said central opening is entirely surrounded by intact portions of said circuit pattern tape;

a plurality of circuit patterns having a first end adjacent said central opening and an opposite second end;

a plurality of dummy circuit patterns on the circuit pattern tape, said dummy circuit patterns being electrically isolated;

a plurality of conductive bonding wires, each extending between one of said bond pads and one of said first ends; and, a resin envelope encapsulating said central opening and covering a portion of the circuit tape around said opening, wherein said resin envelope does not extend to any of said four outer edges of the circuit tape.

* * * * *